United States Patent
Isono et al.

(10) Patent No.: US 11,114,505 B2
(45) Date of Patent: *Sep. 7, 2021

(54) IMAGING DEVICE

(71) Applicant: PANASONIC INTELLECTUAL PROPERTY MANAGEMENT CO., LTD., Osaka (JP)

(72) Inventors: Shunsuke Isono, Osaka (JP); Hidenari Kanehara, Kyoto (JP); Sanshiro Shishido, Osaka (JP); Takeyoshi Tokuhara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/078,440

(22) Filed: Oct. 23, 2020

(65) Prior Publication Data

US 2021/0043688 A1    Feb. 11, 2021

Related U.S. Application Data

(63) Continuation of application No. 16/251,599, filed on Jan. 18, 2019, now Pat. No. 10,854,678.

(30) Foreign Application Priority Data

Jan. 23, 2018   (JP) .............................. JP2018-008575

(51) Int. Cl.
*H01L 27/30* (2006.01)
*H04N 5/374* (2011.01)
(Continued)

(52) U.S. Cl.
CPC ...... *H01L 27/307* (2013.01); *H01L 27/14605* (2013.01); *H01L 27/14607* (2013.01);
(Continued)

(58) Field of Classification Search
CPC ............. H01L 27/307; H01L 27/14605; H01L 27/14607; H01L 27/14665; H01L 27/14636
See application file for complete search history.

(56) References Cited

U.S. PATENT DOCUMENTS

2011/0115043 A1   5/2011   Takata
2015/0002719 A1   1/2015   Isono et al.
(Continued)

FOREIGN PATENT DOCUMENTS

JP    2011-071483    4/2011
JP    2011-108926    6/2011
(Continued)

OTHER PUBLICATIONS

Non-Final Office Action issued in U.S. Appl. No. 16/251,599, dated Dec. 31, 2019.
(Continued)

*Primary Examiner* — Mohammed R Alam
(74) *Attorney, Agent, or Firm* — McDermott Will and Emery LLP

(57) ABSTRACT

An imaging device including a semiconductor substrate including a pixel region and a peripheral region; an insulating layer covering the pixel and peripheral regions; first electrodes located on the insulating layer above the pixel region; a photoelectric conversion layer covering the first electrodes; a second electrode that covers the photoelectric conversion layer; detection circuitry electrically connected to the first electrodes; peripheral circuitry electrically connected to the detection circuitry, and; a third electrode located on the insulating layer. The second electrode includes a connection region in which the second electrode is connected to third electrode, the connection region overlaps analog circuitry in a plan view, and in any cross-sections perpendicular to a surface of the semiconductor substrate and parallel to a column or row direction and that
(Continued)

intersects at least one of the first electrodes, the digital circuitry includes no transistor that is located directly below the connection region.

14 Claims, 18 Drawing Sheets

(51) Int. Cl.
*H04N 5/376* (2011.01)
*H01L 27/146* (2006.01)

(52) U.S. Cl.
CPC .. *H01L 27/14636* (2013.01); *H01L 27/14665* (2013.01); *H04N 5/374* (2013.01); *H04N 5/376* (2013.01); *H01L 27/14603* (2013.01); *H01L 27/14612* (2013.01); *H01L 27/14621* (2013.01); *H01L 27/14623* (2013.01); *H01L 27/14627* (2013.01); *H01L 27/14643* (2013.01)

(56) References Cited

U.S. PATENT DOCUMENTS

| | | |
|---|---|---|
| 2016/0037107 A1 | 2/2016 | Sakaguchi |
| 2016/0043144 A1* | 2/2016 | Sato ..................... H04N 5/335 |
| | | 438/59 |

FOREIGN PATENT DOCUMENTS

| | | |
|---|---|---|
| JP | 2012-114197 | 6/2012 |
| JP | 2016-033980 | 3/2016 |

OTHER PUBLICATIONS

Notice of Allowance issued in U.S. Appl. No. 16/251,599, dated Jul. 29, 2020.

* cited by examiner

IMAGING DEVICE

CROSS-REFERENCE OF RELATED APPLICATIONS

This application is a Continuation of U.S. patent application Ser. No. 16/251,599, filed on Jan. 18, 2018, which claims the benefit of Japanese Application No. 2018-008575, filed on Jan. 23, 2018, the entire disclosures of which Applications are incorporated by reference herein.

BACKGROUND

1. Technical Field

The present disclosure relates to an imaging device.

2. Description of the Related Art

Japanese Patent No. 5637751 (hereinafter referred to as "Patent Document 1") discloses an organic-film stack-type solid-state imaging device. A solid-state imaging device disclosed in Patent Document 1 includes a photoelectric converting section having a structure in which a photoelectric conversion layer is sandwiched between an upper electrode and lower electrodes. A voltage is supplied to the upper electrode via connection electrodes. In the technology disclosed in Patent Document 1, a connection region is arranged in addition to a pixel region and peripheral circuitry, such as a vertical driver, a column analog-to-digital converter (ADC), and a horizontal driver. The connection region is a region in which the upper electrode and the connection electrodes are connected to each other. The connection region is arranged between the pixel region and a pad.

SUMMARY

In imaging devices, it is desired that an increase in chip areas be suppressed. Also, in stack-type image sensors, it is desired to enhance the adhesion between an upper electrode and a photoelectric conversion layer and the adhesion between the photoelectric conversion layer and lower electrodes.

In one general aspect, the techniques disclosed here feature an imaging device including: a semiconductor substrate including a pixel region in which pixels are arranged and a peripheral region adjacent to the pixel region; an insulating layer that covers the pixel region and the peripheral region; first electrodes located on the insulating layer above the pixel region and arranged two-dimensionally in a column direction and a row direction; a photoelectric conversion layer that covers the first electrodes; a second electrode that covers the photoelectric conversion layer; detection circuitry located in the pixel region and configured to be electrically connected to the first electrodes; peripheral circuitry located in the peripheral region, configured to be electrically connected to the detection circuitry, and including analog circuitry and digital circuitry; and a third electrode located on the insulating layer above the peripheral region. The second electrode extends above the peripheral region, the second electrode includes a connection region in which the second electrode is connected to third electrode, the connection region overlaps the analog circuitry in a plan view, and in any cross-sections that are perpendicular to a surface of the semiconductor substrate and parallel to the column direction or the row direction and that intersects at least one of the first electrodes, the digital circuitry includes no transistor that is located directly below the connection region.

It should be noted that general or specific embodiments may be implemented as an element, a device, an apparatus, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Findings of Present Inventors)

Figure 1:
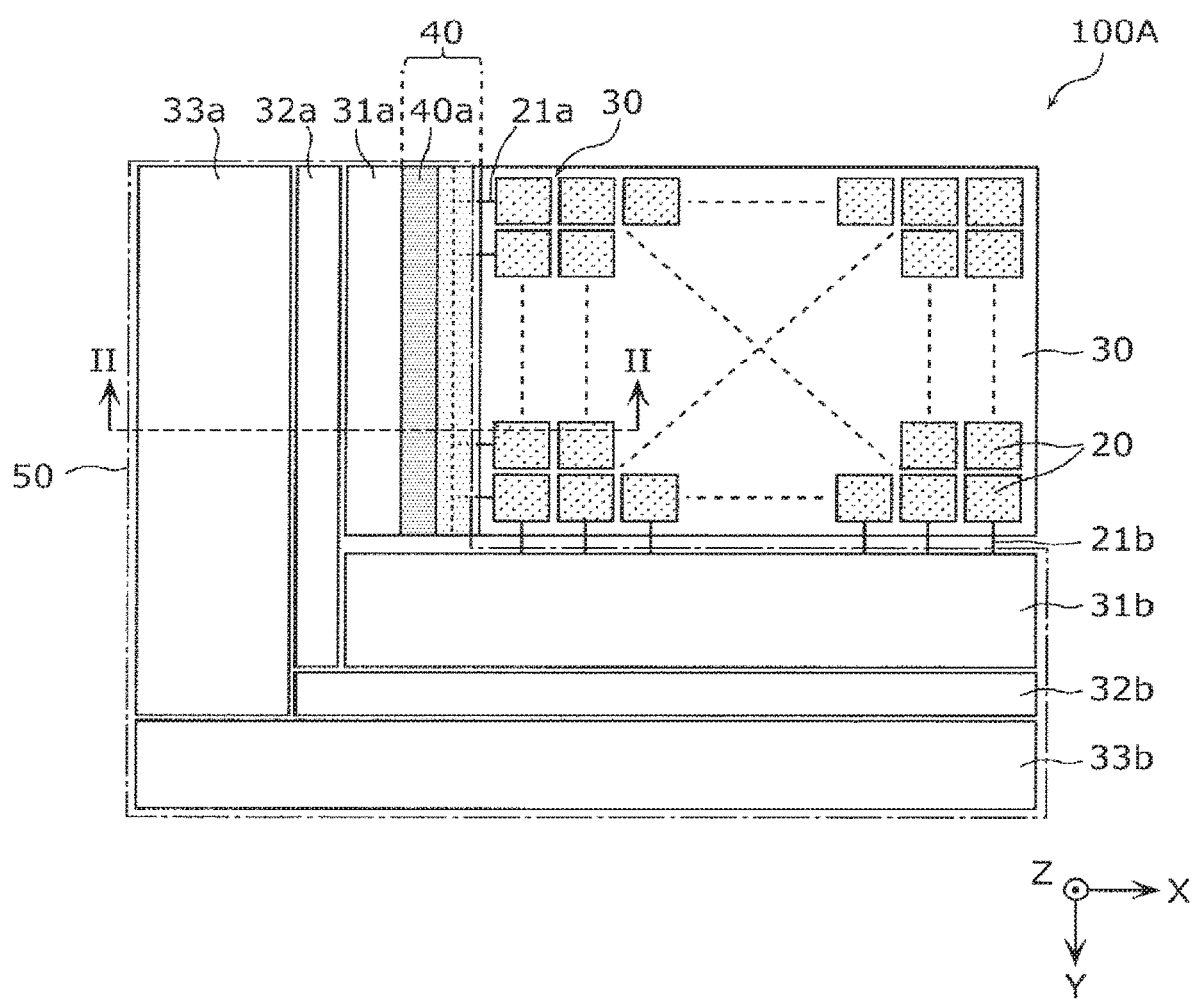
FIG. 1 is a view illustrating one example of a planar structure of an imaging device according to a first embodiment.

In the technology disclosed in Patent Document 1, the connection region is arranged in a region other than the pixel region and a peripheral region including the peripheral circuitry. Consequently, there is a problem in that the chip area increases.

As a result of carrying out extensive and earnest study in view of the foregoing situation, the present inventors have found that an increase in the chip area can be suppressed by arranging the connection region and the peripheral region so that they overlap each other in plan view. Also, there are cases in which, for example, material, such as organic material, with which the force of adhesion between the lower electrodes and the insulating layer and between the insulating layer and the upper electrode is small is used as material of the photoelectric conversion layer. The present inventors have found that, even in such cases, the adhesion between the lower electrodes and the insulating layer and the adhesion between the insulating layer and the upper electrode can be enhanced by covering the entire photoelectric conversion with the upper electrode.

An overview of one aspect of the present disclosure will be described below.

[Item 1]

An imaging device includes:

a semiconductor substrate including a pixel region in which pixels are arranged and a peripheral region adjacent to the pixel region;

an insulating layer that covers the pixel region and the peripheral region;

a first electrode located on the insulating layer above the pixel region;

a photoelectric conversion layer that covers the first electrode;

a second electrode that covers the photoelectric conversion layer;

detection circuitry located in the pixel region and connected to the first electrode;

peripheral circuitry located in the peripheral region and connected to the detection circuitry; and a third electrode located on the insulating layer above the peripheral region, wherein the second electrode extends above the peripheral region, and the second electrode includes a connection region in which the second electrode is connected to the third electrode, the connection region overlapping the peripheral circuitry in plan view.

[Item 2]

In the imaging device according to item 1, the peripheral circuitry includes a transistor, and the connection region overlaps the transistors in the plan view.

[Item 3]

In the imaging device according to item 1, the peripheral circuitry includes analog circuitry connected to the detection circuitry, and the connection region overlaps the analog circuitry in the plan view.

[Item 4]

In the imaging device according to item 3, the analog circuitry includes a transistor, and the connection region overlaps the transistors in the plan view.

[Item 5]

In the imaging device according to item 1, the peripheral circuitry includes digital circuitry connected to the detection circuitry, and the connection region overlaps the digital circuitry in the plan view.

[Item 6]

In the imaging device according to item 5, the digital circuitry includes a transistor, and the connection region overlaps the transistors in the plan view.

[Item 7]

In the imaging device according to item 5 or 6, the peripheral circuitry includes analog circuitry connected between the digital circuitry and the detection circuitry, and the connection region does not overlap the analog circuitry in the plan view.

[Item 8]

In the imaging device according to item 1, the peripheral circuitry includes analog circuitry connected to the detection circuitry, a wire connected to the analog circuitry, and digital circuitry connected to the analog circuitry through the wires; and the connection region overlaps the wires in the plan view.

[Item 9]

In the imaging device according to item 1, the peripheral circuitry includes analog circuitry connected to the detection circuitry, and a wire for connecting the analog circuitry to external circuitry, and the connection region overlaps the wire in the plan view.

[Item 10]

In the imaging device according to one of items 1 to 9, the second electrode includes, above the peripheral region, a first region in which the photoelectric conversion layer is not present between the second electrode and the insulating layer, and the first region includes the connection region and a non-connection region other than the connection region.

[Item 11]

In the imaging device according to item 10, in a direction from the pixel region toward the peripheral region, the non-connection region has a length that is greater than a length of the connection region.

[Item 12]

In the imaging device according to one of items 1 to 11, in the plan view, the second electrode has an area that is larger than an area of the pixel region.

[Item 13]

The imaging device according to one of items 10 to 12 further includes a shield wire located, in the plan view, between the non-connection region and the peripheral circuitry or between the non-connection region and a wire connected to the peripheral circuitry.

[Item 14]

In the imaging device according to item 13, the peripheral circuitry includes analog circuitry, and the shield wire is located, in the plan view, between the non-connection region and the analog circuitry or between the non-connection region and a wire connected to the analog circuitry.

[Item 15]

In the imaging device according to one of items 1 to 14, the plurality of pixels are arranged on the pixel region in a matrix, and the connection region is arranged along two or more sides of the pixel region.

[Item 16]

In the imaging device according to one of items 1 to 15, the second electrode covers more than half of first electrodes located above the pixel region,

[Item 17]

In the imaging device according to one of items 1 to 16, the third electrode and the first electrodes are in contact with a single continuous layer.

[Item 18]

In the imaging device according to one of items 1 to 17, the third electrode contains a material that is the same as a material that the first electrode contains,

[Item 19]

In the imaging device according to one of items 1 to 18, the third electrode contains at least copper, tungsten, titanium, tantalum, or aluminum.

[Item 20]

In the imaging device according to one of items 1 to 19, the second electrode covers an entire portion of the photoelectric conversion layer.

An imaging device according to one aspect of the present disclosure includes: a semiconductor substrate, a pixel region in which a plurality of pixels is arranged above the semiconductor substrate in a matrix, and a peripheral region arranged at a periphery of the pixel region in plan view and including peripheral circuitry. The pixel region includes lower electrodes, an upper electrode that opposes the lower electrodes, a photoelectric conversion layer provided between the lower electrodes and the upper electrode, and detection circuitry located above the semiconductor substrate to detect potentials of the lower electrodes. The upper electrode has a first region that overlaps the peripheral region in plan view, and the first region includes a connection region in which the upper electrode is connected to a connection electrode containing material that is different from material of the upper electrode.

According to the above-described configuration, since the upper electrode has the first region that overlaps the peripheral region, and the first region includes the connection region in which the upper electrode is connected to the connection electrode, the connection region is arranged so as to overlap the peripheral region in plan view. This makes it possible to suppress an increase in the chip area.

For example, in the imaging device according to one aspect of the present disclosure, the first region may further have a non-connection region, which is not connected to the connection electrode in plan view.

According to the above-described configuration, since the first region has the connection region and the non-connection region, the area in which the first region overlaps the peripheral region increases. Accordingly, an increase in the chip area can be suppressed, compared with a case in which the first region and the peripheral region are arranged so that they do not overlap each other. Also, since the first region has the connection region and the non-connection region, it is possible to increase the area in which the upper electrode covers the photoelectric conversion layer, the lower electrodes, and peripheral portions thereof. This makes it possible to enhance the adhesion between the upper electrode and the photoelectric conversion layer and the adhesion between the photoelectric conversion layer and the lower electrodes.

For example, in the imaging device according to one aspect of the present disclosure, the upper electrode may have a larger area than an area of the pixel region in plan view.

There are cases in which, for example, material, such as organic material, with which the force of adhesion between the lower electrodes and the insulating layer and between the insulating layer and the upper electrode is small is used as material of the photoelectric conversion layer. Even in such a case, according to the above-described configuration, since the upper electrode covers the entire photoelectric conversion layer, it is possible to enhance the adhesion between the upper electrode and the photoelectric conversion layer and the adhesion between the photoelectric conversion layer and the lower electrodes.

For example, in the imaging device according to one aspect of the present disclosure, the peripheral circuitry may have digital circuitry, and the first region may overlap the digital circuitry in plan view.

According to the above-described configuration, since at least one of the non-connection region and the connection region is arranged above the digital circuitry, which is robust against noise, it is possible to further suppress an increase in the chip area, without impairing characteristics of the peripheral circuitry. Also, since the first region is arranged to extend to the digital circuitry in plan view, the area of the first region increases. This makes it possible to increase the area in which the upper electrode covers the photoelectric conversion layer and the lower electrodes, thus making it possible to enhance the adhesion between the upper electrode and the photoelectric conversion layer and the adhesion between the photoelectric conversion layer and the lower electrodes.

For example, in the imaging device according to one aspect of the present disclosure, the peripheral circuitry may have analog circuitry located between the pixel region and the digital circuitry, and in plan view, the non-connection region may overlap the analog circuitry, and the connection region may overlap the digital circuitry.

According to the above-described configuration, since the connection region is arranged above the digital circuitry, which is robust against noise, and the non-connection region is arranged on analog circuitry, which is susceptible to noise, it is possible to reduce influences of noise on the peripheral circuitry.

For example, in the imaging device according to one aspect of the present disclosure, the peripheral region may have digital circuitry and a wire region located between the pixel region and the digital circuitry and including wires connected to the digital circuitry, and the first region may overlap the wire region in plan view.

According to the above-described configuration, since the first region is arranged above the wires, it is possible to suppress an increase in the chip area, without impairing characteristics of the peripheral circuitry. Also, since the first region is arranged to extend to the wire region in plan view, the area of the first region increases. This makes it possible to increase the area in which the upper electrode covers the photoelectric conversion layer and the lower electrodes, thus making it possible to enhance the adhesion between the upper electrode and the photoelectric conversion layer and the adhesion between the photoelectric conversion layer and the lower electrodes.

For example, in the imaging device according to one aspect of the present disclosure, the peripheral region may have analog circuitry located between the pixel region and the wire region, and in plan view, the non-connection region may overlap the analog circuitry, and the connection region may overlap the wire region.

According to the above-described configuration, since the connection region is arranged above the wires, and the non-connection region is arranged above the analog circuitry, which is susceptible to noise, it is possible to reduce influences of noise on the peripheral circuitry.

For example, in the imaging device according to one aspect of the present disclosure, the peripheral circuitry may have analog circuitry, and the first region may overlap the analog circuitry in plan view.

According to the above-described configuration, the first region is arranged to extend to above the analog circuitry. This makes it possible to increase the area in which the upper electrode covers the photoelectric conversion layer and the lower electrodes in plan view. Thus, it is possible to enhance the adhesion between the upper electrode and the photoelectric conversion layer and the adhesion between the photoelectric conversion layer and the lower electrodes.

For example, the imaging device according to one aspect of the present disclosure may have a shield wire that is located between the pixel region and the connection region in plan view and that is located between wires that connect to the peripheral circuitry and the upper electrode in a plane orthogonal to the semiconductor substrate.

According to the above-described configuration, since the shield wire is arranged between the wires that are connected to the peripheral circuitry and the upper electrode in a plane orthogonal to the semiconductor substrate, the peripheral circuitry and the wires can be protected against external noise.

For example, in the imaging device according to one aspect of the present disclosure, the connection region may be arranged along two or more sides of the pixel region.

According to the above-described configuration, since the connection region is arranged along two or more sides of the pixel region, the area of the first region is further increased in plan view, compared with a case in which the connection region is arranged along one side of the pixel region. This makes it possible to increase the area in which the upper electrode covers the photoelectric conversion layer and the lower electrodes, thus making it possible to enhance the adhesion between the upper electrode and the photoelectric conversion layer and the adhesion between the photoelectric conversion layer and the lower electrodes.

For example, in the imaging device according to one aspect of the present disclosure, the upper electrode may cover more than half of the lower electrodes located in the pixel region.

According to the above-described configuration, since the upper electrode covers more than half of the lower electrodes located in the pixel region, it is possible to increase the area in which the upper electrode covers the photoelectric conversion layer and the lower electrodes in the pixel region. Thus, it is possible to enhance the adhesion between the upper electrode and the photoelectric conversion layer and the adhesion between the photoelectric conversion layer and the lower electrodes.

For example, in the imaging device according to one aspect of the present disclosure, the connection electrode may be located on a layer that is the same as a layer of the lower electrodes.

According to the above-described configuration, since the connection electrode is located on a layer that is the same as a layer of the lower electrodes, the lower electrodes and the connection electrode can be formed in the same process during manufacture. Accordingly, the number of manufacturing processes can be reduced, thus making it possible to reduce the time and cost for the manufacture.

For example, in the imaging device according to one aspect of the present disclosure, the connection electrode may contain material that is the same as material of the lower electrodes.

According to the above-described configuration, since the connection electrode contains material that is the same as material of the lower electrodes, the connection electrode can be formed of material that is the same as material of the lower electrodes. Thus, for example, when the connection electrode is formed on a layer that is the same as a layer of the lower electrodes during manufacture, these electrodes can be formed at the same time. Accordingly, the number of manufacturing processes can be reduced, thus making it possible to reduce the time and cost for the manufacture.

For example, in the imaging device according to one aspect of the present disclosure, the connection electrode may contain at least one of Cu, W, Ti, Ta, and Al.

According to the above-described configuration, the connection electrode can be formed without adding a new process to a currently available complementary metal-oxide semiconductor (CMOS) process.

For example, in the imaging device according to one aspect of the present disclosure, the upper electrode may cover the entire photoelectric conversion layer.

According to the above-described configuration, since the upper electrode covers the entire photoelectric conversion layer, the upper electrode can cover all the pixels included in the pixel region. In this case, since the upper electrode has the first region that overlaps the peripheral region in plan view, it is possible to increase the area in which the upper electrode covers the photoelectric conversion layer and the lower electrodes. This makes it possible to enhance the adhesion between the upper electrode and the photoelectric conversion layer and the adhesion between the photoelectric conversion layer and the lower electrodes.

Embodiments of the present disclosure will be described below in detail with reference to the accompanying drawings.

The embodiments described below each represent a general or specific example. Numerical values, shapes, materials, constituent elements, the arrangement and the connection forms of constituent elements, steps, the order of steps, and so on described in the embodiments below are examples and are not intended to limit the present disclosure. Various aspects described herein can be combined together, as long as such a combination does not cause contradiction. Also, of the constituent elements in the embodiments below, constituent elements not set forth in the independent claim that represents the broadest concept will be described as optional constituent elements. Each figure does not necessarily strictly depict each configuration. In the following description, constituent elements having substantially the same functions are denoted by the same reference numerals, and redundant descriptions may be omitted or simplified.

In the imaging device according to one aspect of the present disclosure, a photoelectric converting section that photoelectrically converts incident light into electrical signals is provided in an upper layer, and a signal processing circuitry portion including silicon-based CMOS circuitry that outputs the electrical signals, obtained by the photoelectric converting section, to outside is provided in a lower layer. Thus, in the imaging device according to one aspect of the present disclosure, since the photoelectric converting section and the signal processing circuitry portion are stacked, they can be designed independently.

First Embodiment

Figure 2:
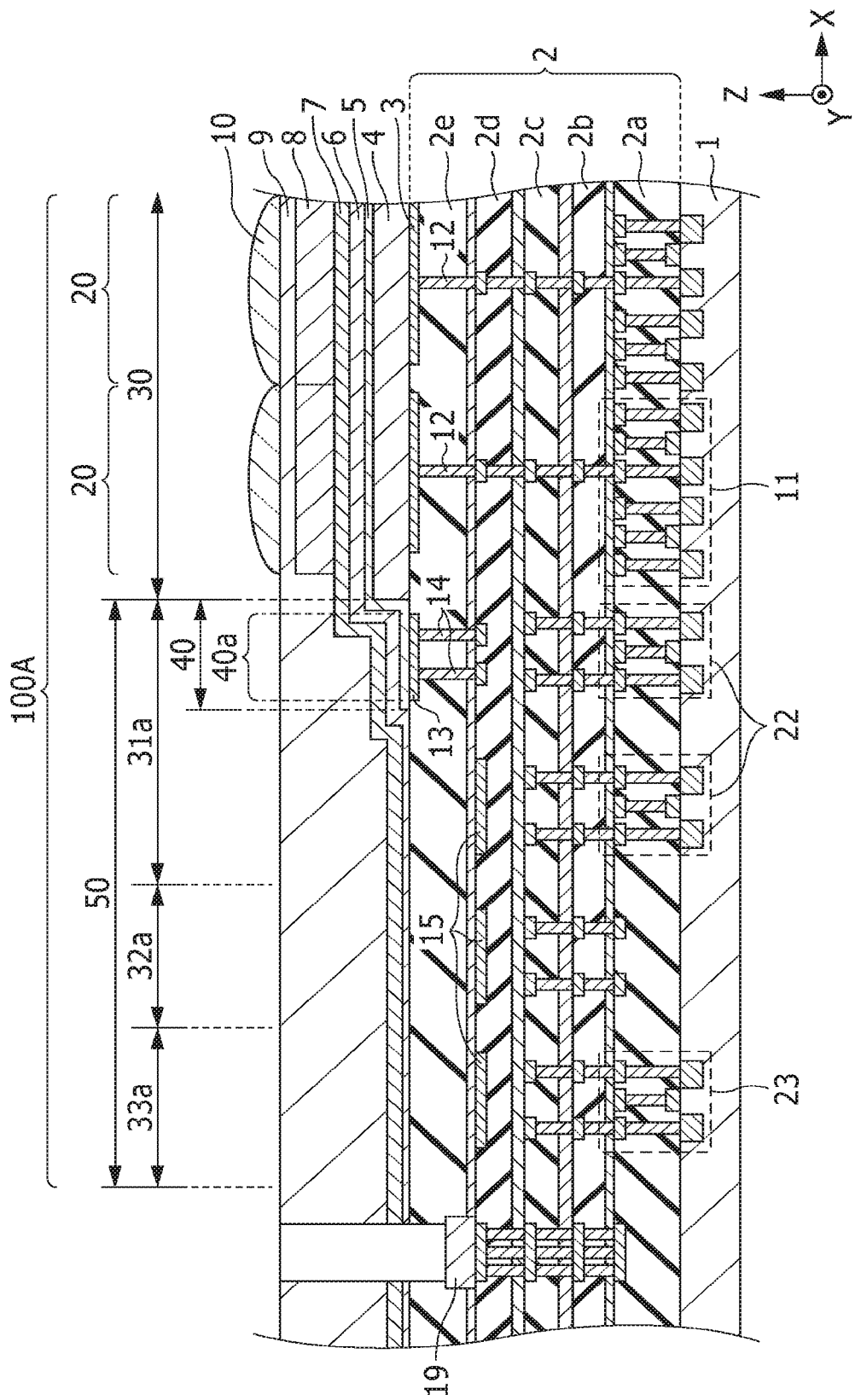
FIG. 2 is a schematic sectional view taken along line II-II in FIG. 1.

An overall configuration of an imaging device according to a first embodiment will be described with reference to FIGS. 1 and 2. FIG. 1 is a view illustrating one example of a planar structure of an imaging device 100A according to the present embodiment. FIG. 2 is a schematic sectional view taken along line II-II in FIG. 1.

As illustrated in FIG. 1, the imaging device 100A includes a semiconductor substrate 1 (see FIG. 2), a pixel region 30 in which a plurality of pixels 20 is arranged above the semiconductor substrate 1 in a matrix, and a peripheral region 50 that is arranged at a periphery of the pixel region 30 in plan view and that includes peripheral circuitry.

The plurality of pixels 20 is, for example, two dimensionally arranged above the semiconductor substrate 1 to thereby form the pixel region 30. In the example illustrated in FIG. 1, the plurality of pixels 20 is arranged in row and column directions. The vertical direction in the plane in FIG. 1 corresponds to the column direction, and the lateral direction corresponds to the row direction. In the illustrated in example, the center of each pixel 20 is located at a grid point in a square grid. Naturally, the arrangement of the pixels 20 is not limited to the illustrated example, and for instance, the plurality of pixels 20 may be arranged so that the center of each pixel 20 is located at a grid point in a triangular grid, a hexagonal grid, or the like. The plurality of pixels 20 may also be arranged one dimensionally. In this case, the imaging device can be used as a line sensor.

In the configuration illustrated in FIG. 1, the peripheral region 50 is arranged at the periphery of the pixel region 30 in plan view and includes the peripheral circuitry. The peripheral region 50 includes analog circuitry, digital circuitry 33a and 33b, and wire regions 32a and 32b.

Examples of the analog circuitry include row scanning circuitry 31a and column circuitry 31b. The row scanning circuitry 31a includes transistors 22 (see FIG. 2) that constitute parts of the circuitry. Similarly, the column circuitry 31b includes transistors (not illustrated) that constitute parts of the circuitry. The digital circuitry 33a includes transistors 23 (see FIG. 2), and the digital circuitry 33b includes transistors (not illustrated). The wire region 32a includes wires that provide connections between the row scanning circuitry 31a and the digital circuitry 33a, and the wire region 32b includes wires that provide connections between the column circuitry 31b and the digital circuitry 33b.

The peripheral circuitry includes the row scanning circuitry 31a and the digital circuitry 33a arranged in the row direction and the column circuitry 31b and the digital circuitry 33b arranged in the column direction.

The wire regions 32a and 32b include wires, such as digital-signal wires, analog-signal wires, and power-supply wires. Each of the wires may be singularly arranged, or the wires may be arranged in a mixed manner. The entire peripheral circuitry may be arranged above the semiconductor substrate 1 above which the pixel region 30 is formed, or part of the peripheral circuitry may be arranged on another substrate.

Based on address signals and control signals generated in the digital circuitry 33a, the row scanning circuitry 31a drives the pixels 20 to be driven in the pixel region 30 through pixel-drive signal lines 21a. In this case, the pixels 20 to be driven are selected for each row. Signal voltages from the selected pixels 20 are transmitted to the column circuitry 31b through vertical signal lines 21b. The column circuitry 31b includes column signal processing circuitry (not illustrated) and column scanning circuitry. The column scanning circuitry is also called horizontal signal reading circuitry. The column signal processing circuitry performs, for example, noise-suppression signal processing, typified by correlated double sampling, and analog-to-digital conversion (AD conversion). The column scanning circuitry is connected to the column signal processing circuitry, which is provided so as to correspond to the columns of the pixels 20. The column scanning circuitry sequentially reads digital signals from the column signal processing circuitry and transmits the digital signals to the digital circuitry 33b. Thus, signals from the pixels 20 driven for each row are transmitted to outside via the digital circuitry 33b.

Next, the configuration of a portion of the imaging device 100A according to the present embodiment will be described in detail with reference to FIG. 2. FIG. 2 is a schematic sectional view taken along line II-II in FIG. 1.

As illustrated in FIG. 2, the imaging device 100A includes the semiconductor substrate 1, the pixel region 30 having the plurality of pixels 20 formed above the semiconductor substrate 1, and the peripheral region 50 that is arranged at the periphery of the pixel region 30 in plan view and that includes the peripheral circuitry. In the imaging device 100A, the pixel region 30 includes lower electrodes 3, an upper electrode 5 that opposes the lower electrodes 3, a photoelectric conversion layer 4 provided between the lower electrodes 3 and the upper electrode 5, and detection circuitry 11 located above the semiconductor substrate 1 to detect potentials of the lower electrodes 3.

In the pixel region 30, the detection circuitry 11 is provided across an interface between the semiconductor substrate 1 and an insulating layer 2 so as to correspond to the respective pixels 20. The lower electrodes 3 are formed on a major surface of the insulating layer 2 at a positive side (hereinafter referred to as an "upper side") in the Z-axis direction, that is, on an upper surface of the insulating layer 2. The lower electrodes 3 are connected to the corresponding detection circuitry 11 through connection portions 12.

The lower electrodes 3 are electrodes for collecting charges generated in the photoelectric conversion layer 4. The lower electrodes 3 are made of, for example, metallic material, such as titanium nitride (TiN). The lower electrodes 3 may also be made of copper (Cu), tungsten ON), titanium (Ti), tantalum (Ta), aluminum (Al), or a compound thereof. The lower electrodes 3 have a uniform film thickness, and upper surfaces thereof are planarized.

The lower electrodes 3 are two dimensionally arranged on the upper surface of the insulating layer 2 along two axes in the X-axis and Y-axis directions. The lower electrodes 3 are arranged on the upper surface of the insulating layer 2, for example, in a matrix and have constant gaps between the lower electrodes 3. The lower electrodes 3 are arranged so as to correspond to the arrangement of the pixels 20. For example, when the plurality of pixels 20 is arranged in a matrix, the lower electrodes 3 are arranged in a matrix so as to correspond to the arrangement of the pixels 20.

The detection circuitry 11 is provided so as to correspond to the respective lower electrodes 3. The detection circuitry 11 detects signal charges collected by the corresponding lower electrodes 3 and outputs signal voltages corresponding to the charges. The detection circuitry 11 is made of, for example, metal oxide semiconductor (MOS) circuitry or thin-film transistor (TFT) circuitry. The detection circuitry 11 incudes, for example, amplifying transistors having gates connected to the corresponding lower electrodes 3, and the amplifying transistors output signal voltages corresponding to the amounts of signal charges. The detection circuitry 11 is light-shielded by a light-shielding layer (not illustrated) provided, for example, in the insulating layer 2.

The connection portions 12 provide electrical connections between the corresponding lower electrodes 3 in the pixels 20 and the corresponding detection circuitry 11. Connection portions 14 provide electrical connection between a connection electrode 13 and a wiring layer. The connection portions 12 and 14 are formed, for example, by embedding conductive material, such as copper (Cu) or tungsten (W), into the insulating layer 2.

The insulating layer 2 is formed on the semiconductor substrate 1 and includes constituent layers 2a, 2b, 2c, 2d, and 2e (hereinafter simply denoted as 2a to 2e). The semiconductor substrate 1 is made of, for example, silicon (Si). The constituent layers 2a to 2e are made of, for example, silicon dioxide ($SiO_2$), For example, wiring layers including wires, contact plugs, and so on are provided in the constituent layers 2a to 2e. The number of constituent layers in the insulating layer 2 may be arbitrarily set and is not limited to the example of five constituent layers 2a to 2e illustrated in FIG. 2.

The photoelectric conversion layer 4 is stacked on an upper surface of the constituent layer 2e in which the lower electrodes 3 are arranged, and the upper electrode 5, a buffer layer 6, and a sealing layer 7 are sequentially stacked on an upper surface of the photoelectric conversion layer 4. Color filters 8 having transmission wavelength bands corresponding to the respective pixels 20 are formed on an upper surface of the sealing layer 7, and microlenses 10 are formed, with a planarization layer 9 being interposed between the color filters 8 and the microlenses 10.

The constituent layer 2e in the insulating layer 2 is interposed in a gap between the adjacent lower electrodes 3.

The photoelectric conversion layer 4 is a layer made of a photoelectric conversion material that generates charges in response to the strength of received light and is sandwiched between the lower electrodes 3 and the upper electrode 5. The photoelectric conversion material is, for example, an organic semiconductor material and includes at least one of a p-type organic semiconductor and an n-type organic semiconductor. It is desirable that the photoelectric conversion layer 4 have a uniform film thickness in the pixel region 30.

The upper electrode 5 is an electrode that opposes the lower electrodes 3. In plan view, the upper electrode 5 has a larger area than the pixel region 30. As illustrated in FIG. 2, the upper electrode 5 is arranged so that, in the pixel region 30, the upper electrode 5 opposes the lower electrodes 3, with the photoelectric conversion layer 4 being interposed between the lower electrodes 3 and the upper electrode 5. In addition, the upper electrode 5 is formed so as to extend in a negative direction (hereinafter may be referred to as "outside") of the X-axis relative to the pixel region 30 and overlaps the peripheral region 50 in plan view.

In the imaging device 100A according to the present embodiment, the upper electrode 5 has a first region 40 that overlaps the peripheral region 50 in plan view. The first region 40 has a connection region 40a connected to the connection electrode 13 containing material that is different from material of the upper electrode 5. That is, the upper electrode 5 is connected to the connection electrode 13 in the first region 40 without the photoelectric conversion layer 4 being interposed therebetween. The connection electrode 13 is connected to, for example, a reference potential through the connection portions 14.

The first region 40 may further have a non-connection region (not illustrated in FIG. 2), which is not connected to the connection electrode 13 in plan view, as described below.

In the present embodiment, the upper electrode 5 is arranged at a side on which light is incident in the imaging device 100A. The upper electrode 5 may have translucency in order to allow light to be incident on the photoelectric conversion layer 4, The material of the upper electrode 5 may be, for example, transparent oxide conductive material, such as indium tin oxide (ITO) or indium zinc oxide (IZO).

The connection electrode 13 is formed of a conductive material different from the material of the upper electrode 5. For example, the connection electrode 13 may contain a highly conductive metallic material. In this case, the connection electrode 13 may contain material that is the same as the material of the lower electrodes 3. For example, the connection electrode 13 may include at least one kind of copper (Cu), tungsten (W), titanium (Ti), tantalum (Ta), and aluminum (Al). The connection electrode 13 may also be a compound of these metallic materials.

The connection electrode 13 is arranged on a layer that is the same as the layer on which the lower electrodes 3 are arranged. That is, the connection electrode 13 and the lower electrodes 3 are in contact with a single continuous layer (in FIG. 2, the constituent layer 2e). When the connection electrode 13 contains material that is the same as the material of the lower electrodes 3 and is arranged in a layer that is the same as the layer in which the lower electrodes 3 are arranged, the connection electrode 13 and the lower electrodes 3 can be formed at the same time. This makes it possible to reduce the manufacturing time and the manufacturing cost. Shield wires 15 may also be provided. The shield wires 15 are described later. The lower electrode 3 exemplifies the first electrode. The upper electrode 5 exemplifies the second electrode. The connection electrode 13 exemplifies the third electrode.

Although not illustrated, a light-shielding layer is formed in a region that is located on the sealing layer 7 and that is other than the region in which the color filters 8 are formed. Formation of the light-shielding layer blocks external light to a region other than an effective pixel region and prevents light incidence on the photoelectric conversion layer 4 in the region other than the effective pixel region. The "effective pixel region" as used herein means a region that is included in the pixel region and in which, for example, the pixels except dummy pixels or detecting dark-time outputs and so on are arranged.

In addition, a pad region is provided at a perimeter of the imaging device 100A. In the pad region, a depression portion that penetrates the planarization layer 9 and reaches the upper surface of the constituent layer 2d in the insulating layer 2 is provided, and a pad 19 is formed on a bottom surface of the depression portion. Although details are not illustrated, the pad 19 is electrically connected to signal input/output circuitry and circuitry for voltage supply and so on. A metal layer in the peripheral region 50 is formed, for example, using copper (Cu).

Although, in the present embodiment, FIGS. 1 and 2 illustrate an example in which the connection region 40a in which the upper electrode 5 and the connection electrode 13 are connected to each other is arranged along one side of the pixel region 30, the connection region 40a may be arranged along two or more sides of the pixel region 30. The number of sides along which the connection region 40a is arranged may be increased or reduced, as appropriate, considering the chip area and wire widths in the imaging device. In embodiments other than the first embodiment and modifications thereof (described below), the connection region 40a may similarly be arranged along two or more sides of the pixel region 30.

Next, a description will be given of an image capture mechanism.

Light that is incident on the imaging device 100A from above passes through the sealing layer 7, the buffer layer 6, and the upper electrode 5 and is incident on the photoelectric conversion layer 4. The photoelectric conversion layer 4 photoelectrically convert the incident light to generate charges in a state in which an appropriate bias voltage is applied to the photoelectric conversion layer 4 by the lower electrodes 3 and the upper electrode 5. A potential difference between the upper electrode 5 and the lower electrodes 3 acts as a bias voltage applied to the photoelectric conversion layer 4.

The charges generated in the photoelectric conversion layer 4, as described above, are transferred from the lower electrodes 3 to corresponding accumulation regions in the detection circuitry 11 through the connection portions 12 and are temporarily accumulated. The charges are then output to outside as signals via switching operations of transistor elements or the like in the detection circuitry 11 at an appropriate timing.

The first region 40 in the imaging device 100A according to the present embodiment overlaps the periphery of the pixel region 30, that is, elements and wires arranged in the peripheral region 50, in plan view, as illustrated in FIG. 2. Examples of the elements arranged in the peripheral region 50 include the transistors 22 in the row scanning circuitry 31a.

Since the first region 40 overlaps the elements and the wires, arranged in the peripheral region 50, in plan view, as described above, it is not necessary to increase the chip area. In other words, since the first region 40 can be arranged so as to overlap the peripheral region 50 in plan view, the chip area can be reduced compared with a known configuration in which the upper electrode and the connection electrode are connected to each other in a region other than the pixel region and the peripheral region.

In the imaging device 100A, the upper electrode 5 covers more than half of the lower electrodes 3 located in the pixel region 30. In this manner, since the upper electrode 5 covers more than half of the lower electrodes 3 located in the pixel region 30, the area in which the upper electrode 5 covers the photoelectric conversion layer 4 and the lower electrodes 3 can be increased in the pixel region 30. Accordingly, it is possible to enhance the adhesion between the upper electrode 5 and the photoelectric conversion layer 4 and the adhesion between the photoelectric conversion layer 4 and the lower electrodes 3.

In the imaging device 100A, the upper electrode 5 covers the entire photoelectric conversion layer 4. Since the upper electrode 5 covers the entire photoelectric conversion layer 4, the upper electrode 5 can cover all the pixels 20 included in the pixel region 30. In this case, since the upper electrode 5 has the first region 40 that overlaps the peripheral region 50 in plan view, it is possible to increase the area in which the upper electrode 5 covers the photoelectric conversion layer 4, the lower electrodes 3, and peripheral portions thereof. This makes it possible to enhance the adhesion between the upper electrode 5 and the photoelectric conversion layer 4 and the adhesion between the photoelectric conversion layer 4 and the lower electrodes 3.

Second Embodiment

Figure 3:
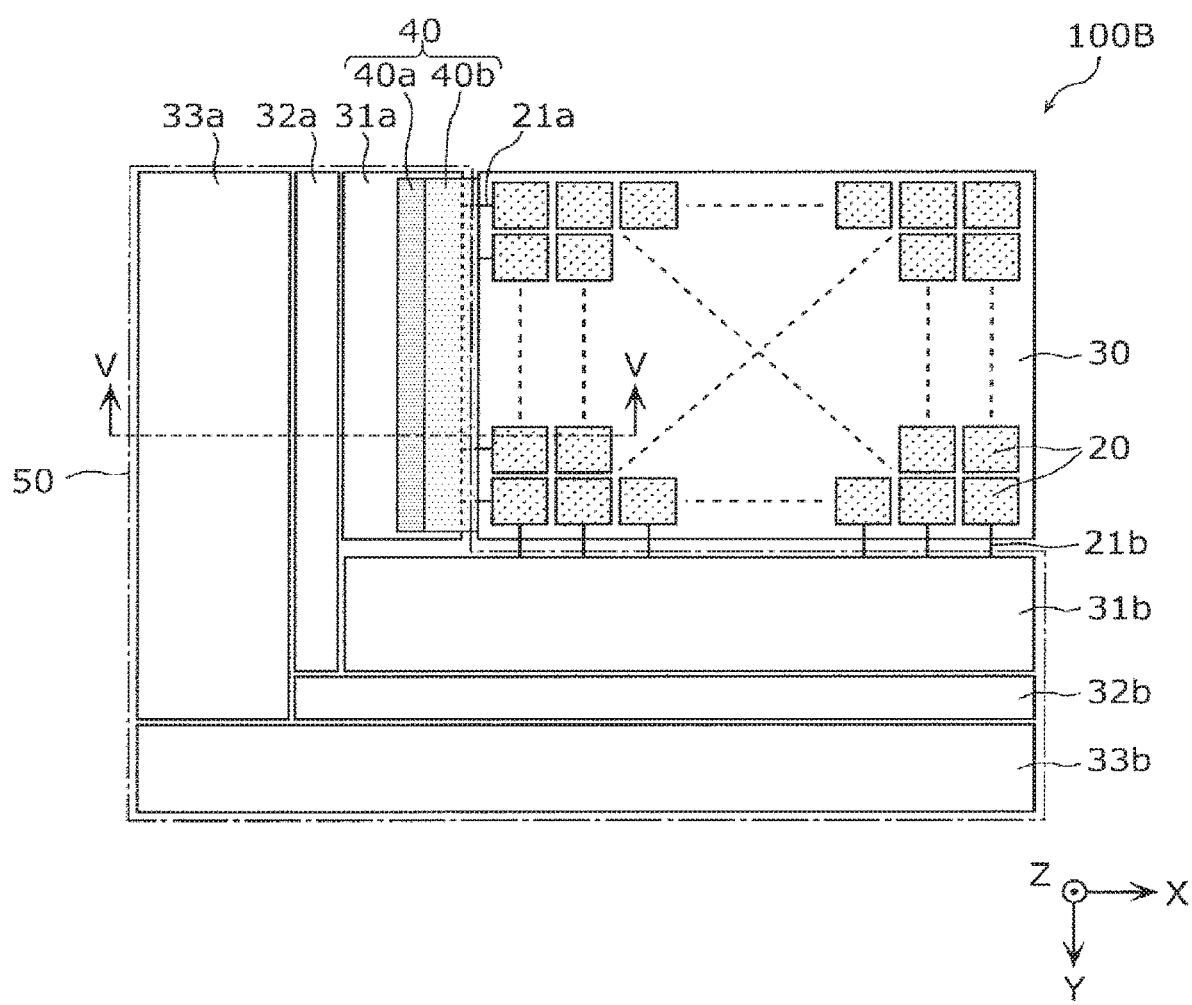
FIG. 3 is a view illustrating one example of a planar structure of an imaging device according to a second embodiment.
Figure 4:
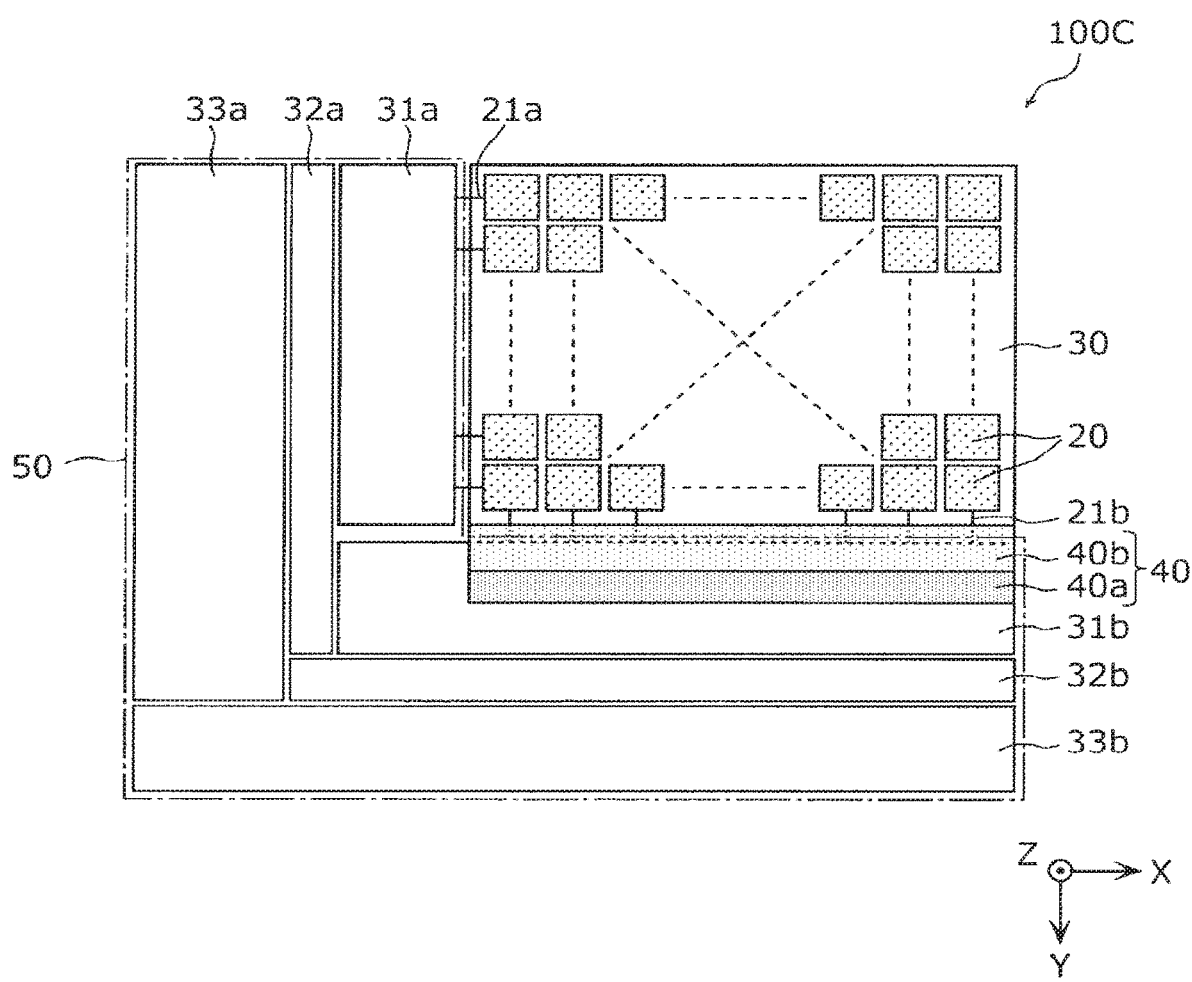
FIG. 4 is a view illustrating one example of a planar structure of an imaging device according to the second embodiment.
Figure 5:
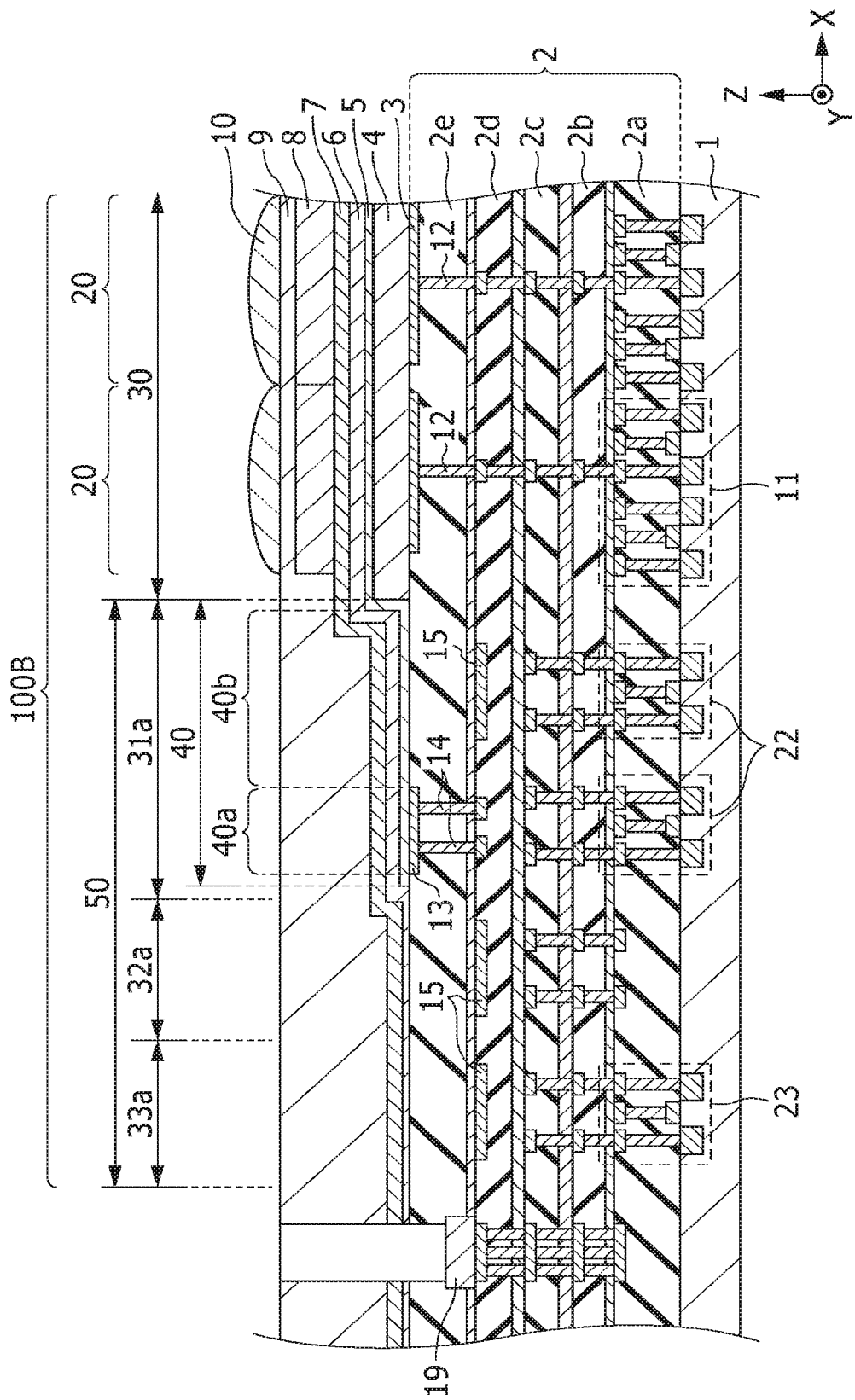
FIG. 5 is a schematic sectional view taken along line V-V in FIG. 3.

An overall configuration of an imaging device according to a second embodiment will be described with reference to FIGS. 3 to 5. FIG. 3 is a diagram illustrating one example of a planar structure of an imaging device 100B according to the present embodiment. FIG. 4 is a diagram illustrating an example of a planar structure of an imaging device 100C according to the present embodiment. FIG. 5 is a schematic sectional view taken along line V-V in FIG. 3.

In the imaging device 100B illustrated in FIG. 3, the first region 40 extends from the pixel region 30 toward a negative side in the X-axis direction and overlaps the row scanning circuitry 31a in plan view. The X-axis direction in this case is the so-called row direction. In the imaging device 1000 illustrated in FIG. 4, the first region 40 extends from the pixel region 30 toward a positive side in the Y-axis direction and overlaps the column circuitry 31b in plan view. The Y-axis direction in this case is the so-called column direction, Each of the row scanning circuitry 31a and the column circuitry 31b is analog circuitry.

Differences from the first embodiment will be described below.

In each of the imaging devices 100B and 1000 in the present embodiment, the first region 40 further has a non-connection region 40b, which is not connected to the connection electrode 13 (see FIG. 5) in plan view. Since the first region 40 has the connection region 40a and the non-connection region 40b, the area of the first region 40 increases. Accordingly, it is possible to increase the area in which the upper electrode 5 covers the photoelectric conversion layer 4, the lower electrodes 3, and peripheral portions thereof, thus enhancing the adhesion between the upper electrode 5 and the photoelectric conversion layer 4 and the adhesion between the photoelectric conversion layer 4 and the lower electrodes 3. This makes it possible to more uniformly apply a voltage to the photoelectric conversion layer 4 via the upper electrode 5. Also, since the first region 40 overlaps the peripheral region 50 in plan view, the chip area can be reduced compared with a case in which the first region 40 and the peripheral region 50 are arranged so as not to overlap each other. In addition, it is possible to increase the ratio of a light-receiving area to the chip area. Also, the length of the non-connection region may be made larger than the length of the connection region in the direction from the pixel region 30 toward the peripheral region 50 (e.g., the negative direction on the X axis in FIG. 5). This makes it possible to further enhance the adhesion between the upper electrode 5 and the photoelectric conversion layer 4 and the adhesion between the photoelectric conversion layer 4 and the lower electrodes 3.

Also, in each of the imaging devices 100B and 100C, the peripheral circuitry has analog circuitry, and the first region 40 overlaps the analog circuitry in plan view. In plan view, the peripheral circuitry is included in the peripheral region 50 arranged at the periphery of the pixel region 30. The analog circuitry included in the peripheral circuitry includes the row scanning circuitry 31a and column circuitry (not illustrated).

As described above, in the present embodiment, the first region 40 further extends above the analog circuitry. This makes it possible to increase the area in which the upper electrode 5 covers the photoelectric conversion layer 4, the lower electrodes 3, and the peripheral portions thereof in plan view, thus making it possible to enhance the adhesion between the upper electrode 5 and the photoelectric conversion layer 4 and the adhesion between the photoelectric conversion layer 4 and the lower electrodes 3.

In the present embodiment, the description has been given of an example in which the first region 40 extends from the pixel region 30 to the left side in the row direction or to the lower side in the column direction, that is, an example in which the connection region 40a is arranged along one side of the pixel region 30. The connection region 40a may also be arranged along two or more sides of the pixel region 30. For example, the first region 40 may extend from the pixel region 30 to both left and right sides in the row direction or may extend to upper and lower sides in the column direction. The first region 40 may extend from the pixel region 30 to one side in the row direction or to one side in the column direction. The first region 40 may extend from the pixel region 30 to both the left and right sides in the row direction and both the left and right sides in the column direction. That is, the first region 40 may be arranged along one or both of the left and right sides of the pixel region 30 in plan view or may be arranged along one or both of the upper and lower sides of the pixel region 30. The first region 40 may also be arranged along four sides, that is, the upper, lower, left, and right sides, of the pixel region 30 in plan view.

When the connection region 40a is arranged along two or more sides of the pixel region 30, as described above, the area of the first region 40 increases compared with a case in which the connection region 40a is arranged along only one side of the pixel region 30. This makes it possible to ensure a large area in which the first region 40 overlaps the insulating layer 2 in the peripheral region 50, thus making it possible to enhance the adhesion of the upper electrode 5 to the insulating layer 2. Also, since it is possible to increase the area in which the upper electrode 5 covers the photoelectric conversion layer 4, the lower electrodes 3, and the peripheral portions thereof, thus making it possible to enhance the adhesion between the upper electrode 5 and the photoelectric conversion layer 4 and the adhesion between the photoelectric conversion layer 4 and the lower electrodes 3.

The configuration of a portion of the imaging device 100B according to the present embodiment will be described below with reference to FIG. 5. FIG. 5 is a schematic sectional view taken along line V-V in FIG. 3.

Differences from the first embodiment will be described below.

In the imaging device 100B according to the present embodiment, the first region 40 further has the non-connection region 40b, which is not connected to the connection electrode 13 in plan view. The first region 40 is a region in which the upper electrode 5 overlaps the peripheral region 50 in plan view. Thus, at least either the non-connection region 40b or the connection region 40a overlaps the peripheral region 50 in plan view.

In the present embodiment, the first region 40 overlaps the row scanning circuitry 31a in plan view. The row scanning circuitry 31a includes the transistors 22 as elements that constitute the row scanning circuitry 31a. In the example illustrated in FIG. 5, the non-connection region 40b and the connection region 40a both overlap, in plan view, elements that are included in the peripheral circuitry arranged at the periphery of the pixel region 30 and that constitute the row scanning circuitry 31a, In the present embodiment, the arrangement is not limited to this example, and it is sufficient that at least one of the non-connection region 40b and the connection region 40a overlap, in plan view, the row scanning circuitry 31a or wires that are connected to the row scanning circuitry 31a, for example, wires for connecting the row scanning circuitry 31a to external circuitry.

Since at least one of the connection region 40a and the non-connection region 40b in the first region 40 overlaps, in plan view, the elements that constitute the row scanning circuitry 31a and the wires that are connected to the row scanning circuitry 31a, the elements and the wires being included in the peripheral circuitry arranged at the periphery of the pixel region 30, it is possible to reduce the chip area. That is, since, in the present embodiment, the first region 40 overlaps the peripheral region 50 in plan view, an increase in the chip area can be suppressed compared with a known configuration in which the first region 40 is provided without overlapping the peripheral region 50. This allows each of the imaging devices 100B and 100D according to the present embodiment to achieve a chip area that is equivalent to a chip area in a typical CMOS sensor using photodiodes.

In addition, with the above-described configuration, a larger area can be ensured for the first region 40 than that in the known configuration, without increasing the chip area. This makes it possible to increase the area in which the upper electrode 5 covers the photoelectric conversion layer 4, the lower electrodes 3, and the peripheral portions thereof in plan view, thus making it possible to enhance the adhesion between the upper electrode 5 and the photoelectric conversion layer 4 and the adhesion between the photoelectric conversion layer 4 and the lower electrodes 3. Accordingly, in the pixel region 30, a more uniform voltage can be applied to the photoelectric conversion layer 4 via the upper electrode 5. In addition, since the distance from an end portion of the upper electrode 5 to an end portion of the photoelectric conversion layer 4 increases, thus making it possible to reduce damage to the photoelectric conversion layer 4 during fabrication of the upper electrode 5.

More specifically, for example, when the upper electrode 5 is patterned with plasma, there are cases in which the end portion of the upper electrode 5 is damaged. When the distance from the end portion of the upper electrode 5 to the end portion of the photoelectric conversion layer 4 is large, the possibility that the photoelectric conversion layer 4 is damaged can be reduced even if the end portion of the upper electrode 5 is damaged.

(First Modification of Second Embodiment)

Figure 6:
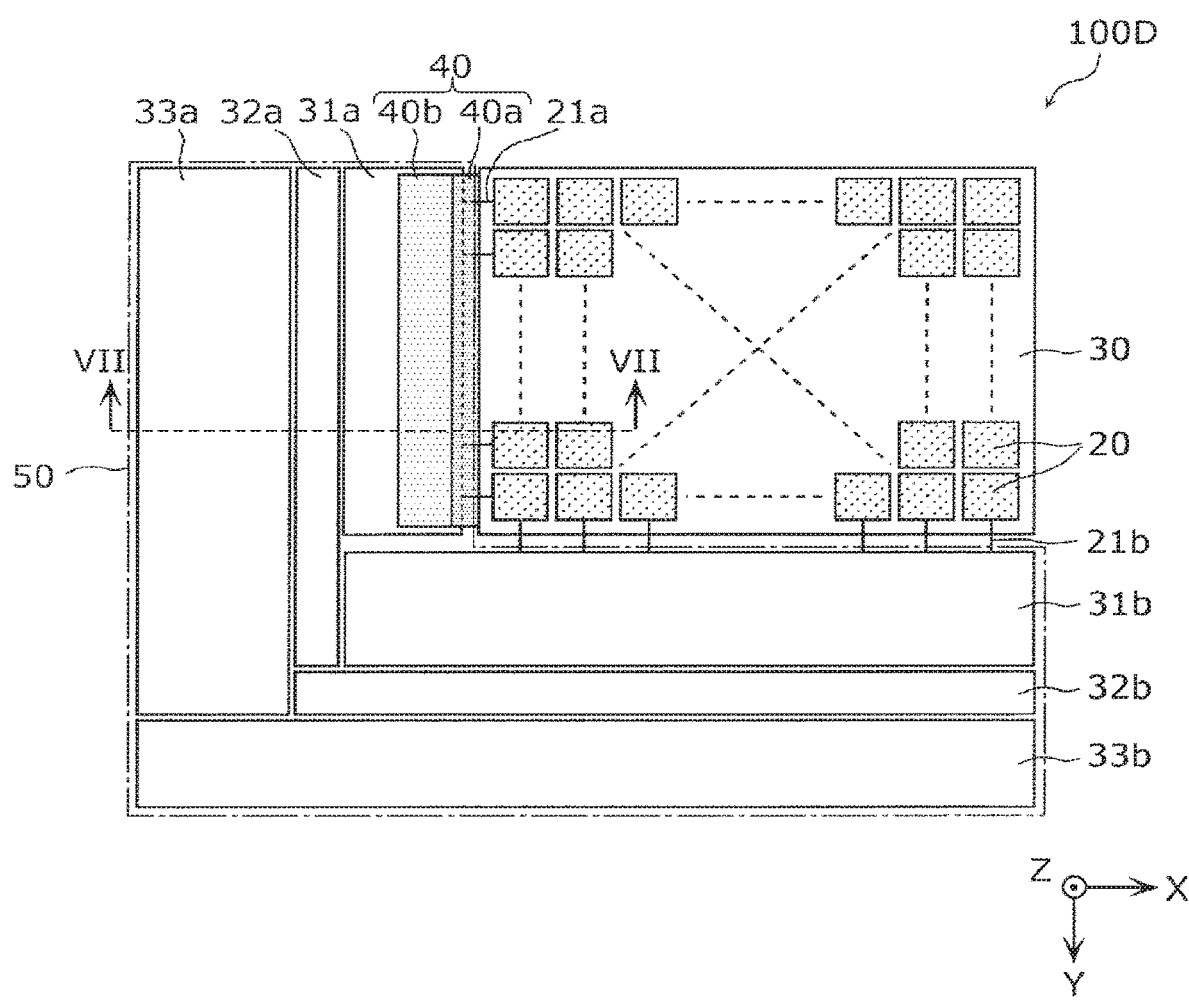
FIG. 6 is a view illustrating one example of a planar structure of an imaging device according to a modification of the second embodiment.
Figure 7:
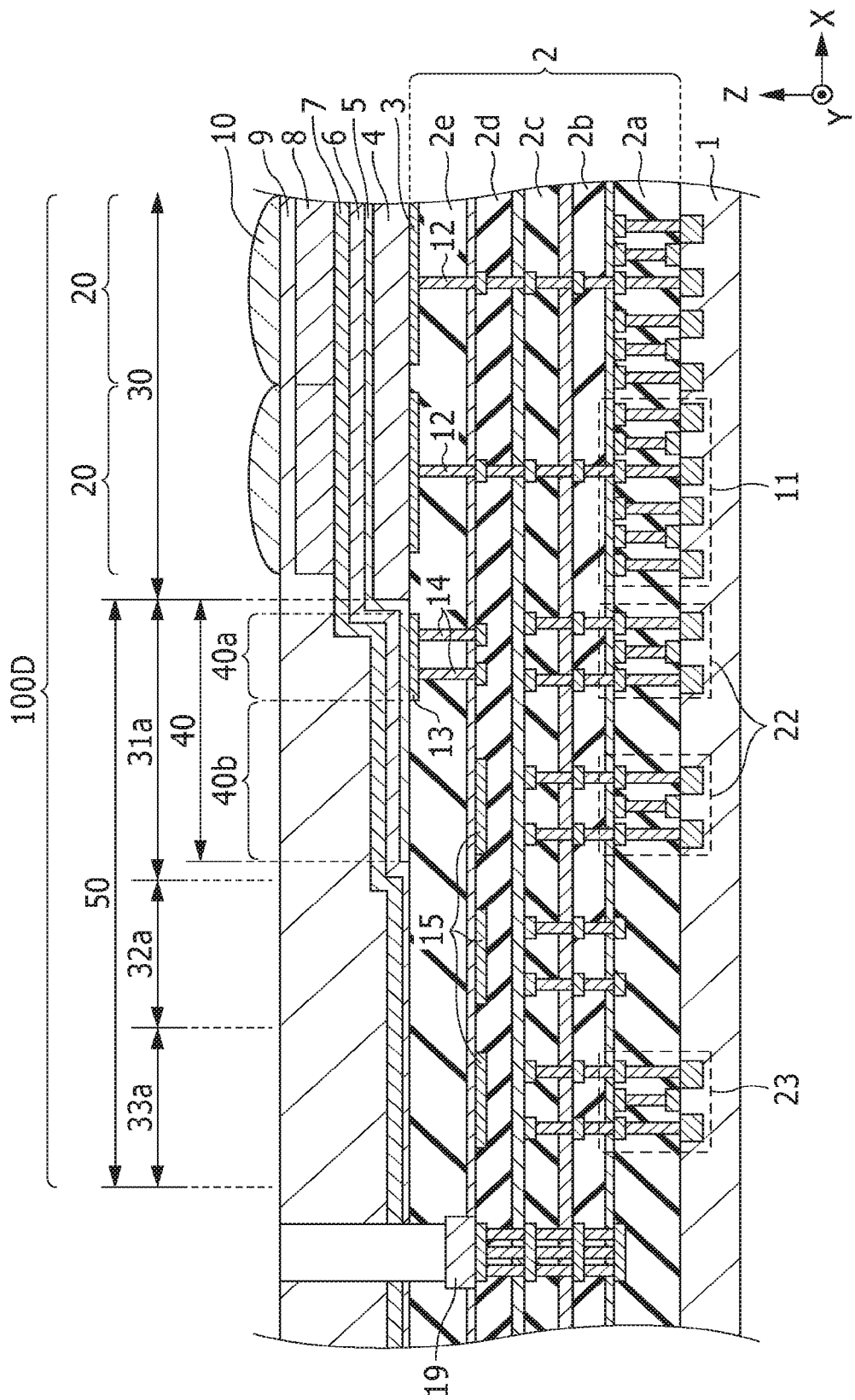
FIG. 7 is a schematic sectional view taken along line VII-VII in FIG. 6.

Next, an imaging device according to a first modification of the second embodiment will be described with reference to FIGS. 6 and 7. FIG. 6 is a diagram illustrating one example of a planar structure of an imaging device 100D according to this modification. FIG. 7 is a schematic sectional view taken along line in FIG. 6.

The above description in the second embodiment has been given of an example in which the non-connection region 40b is arranged at a position closer to the pixel region 30 than the connection region 40a, as illustrated in FIGS. 3 to 5. In the imaging device 100D according to this modification, the connection region 40a is arranged at a position closer to the pixel region 30 than the non-connection region 40b, as illustrated in FIGS. 6 and 7. This modification also provides advantages that are the same as or similar to those in the second embodiment.

In embodiments below and modifications thereof, the connection region 40a may also be arranged at a position closer to the pixel region 30 than the non-connection region 40b, as in this modification.

Third Embodiment

Figure 8:
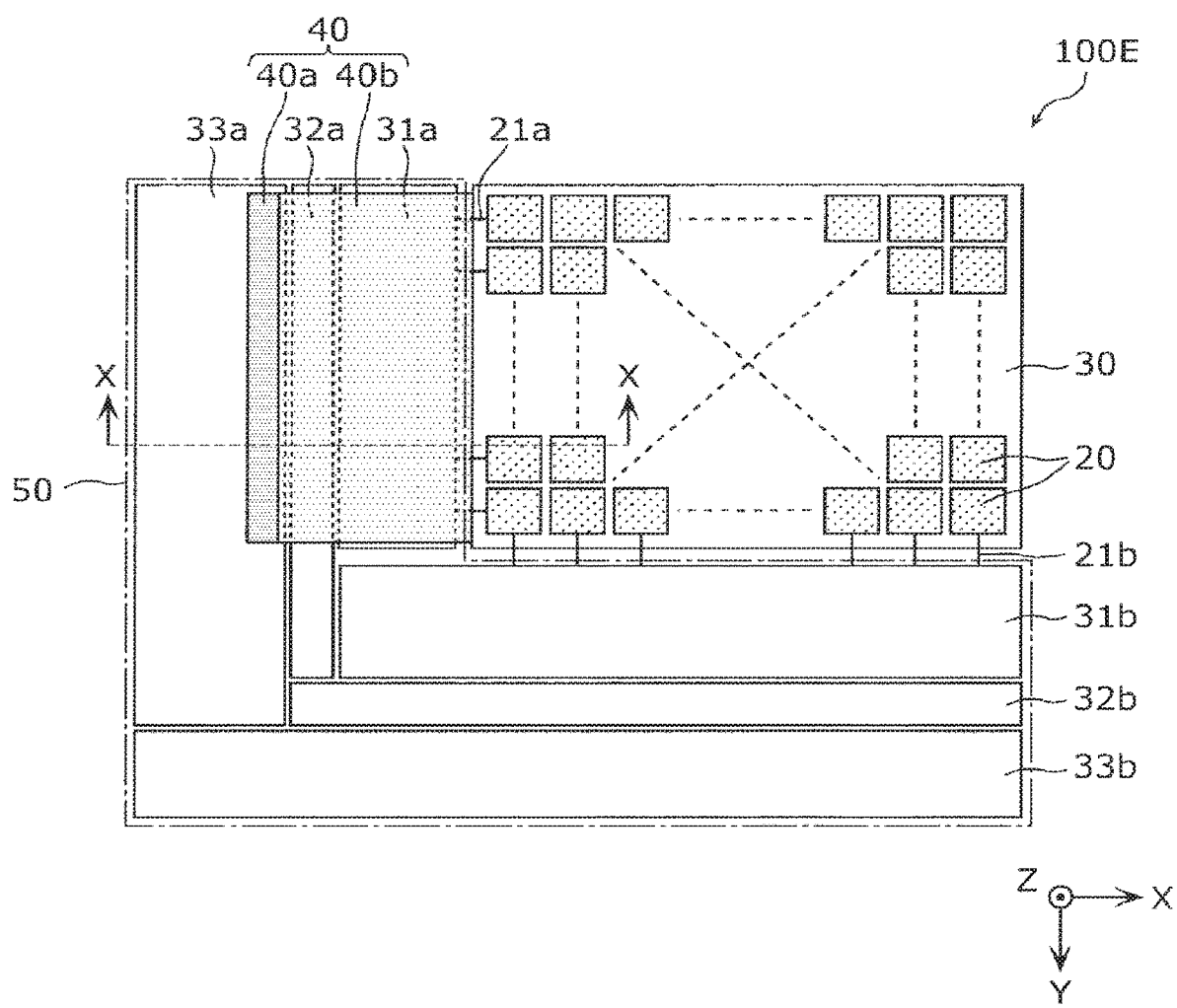
FIG. 8 is a view illustrating one example of a planar structure of an imaging device according to a third embodiment.
Figure 9:
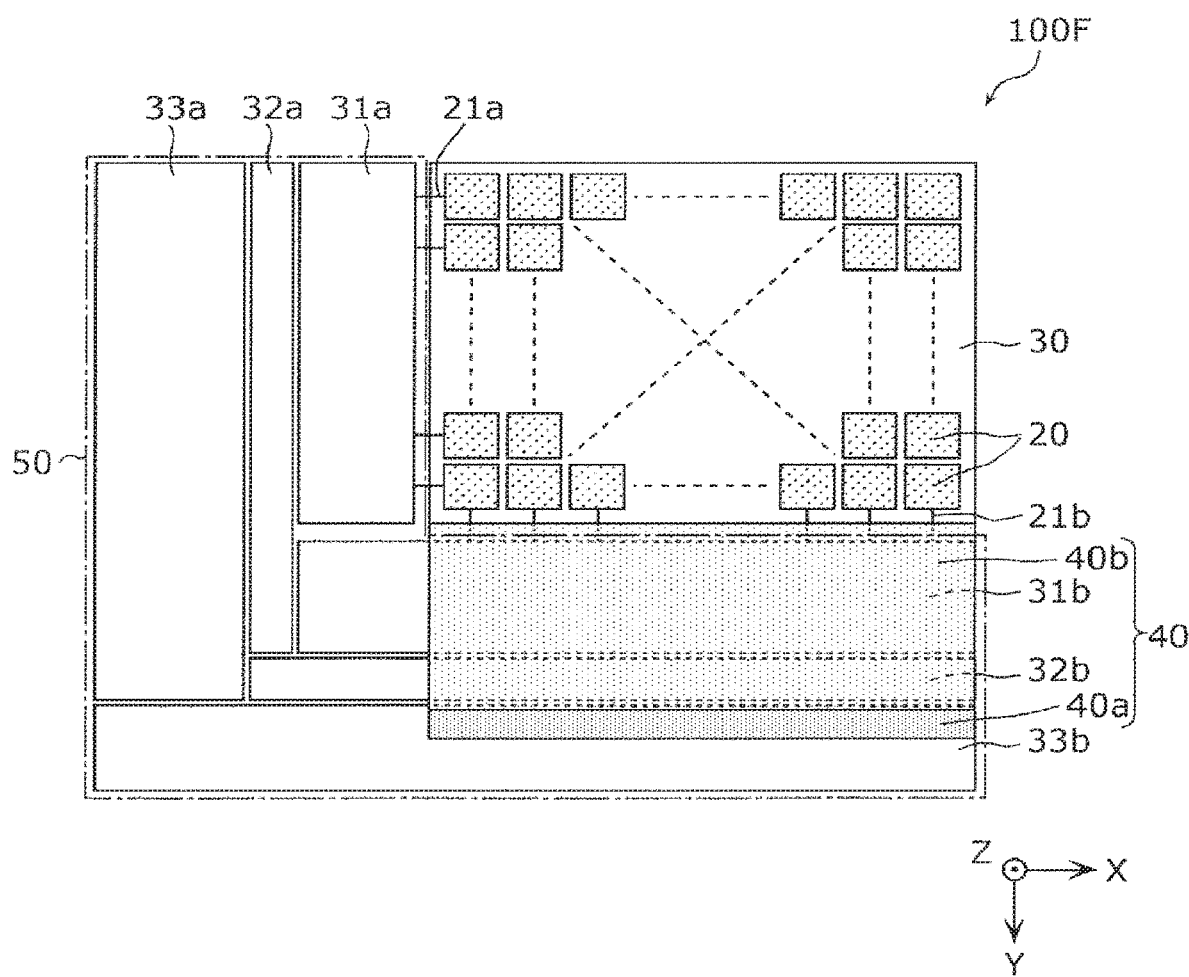
FIG. 9 is a view illustrating one example of a planar structure of an imaging device according to the third embodiment.
Figure 10:
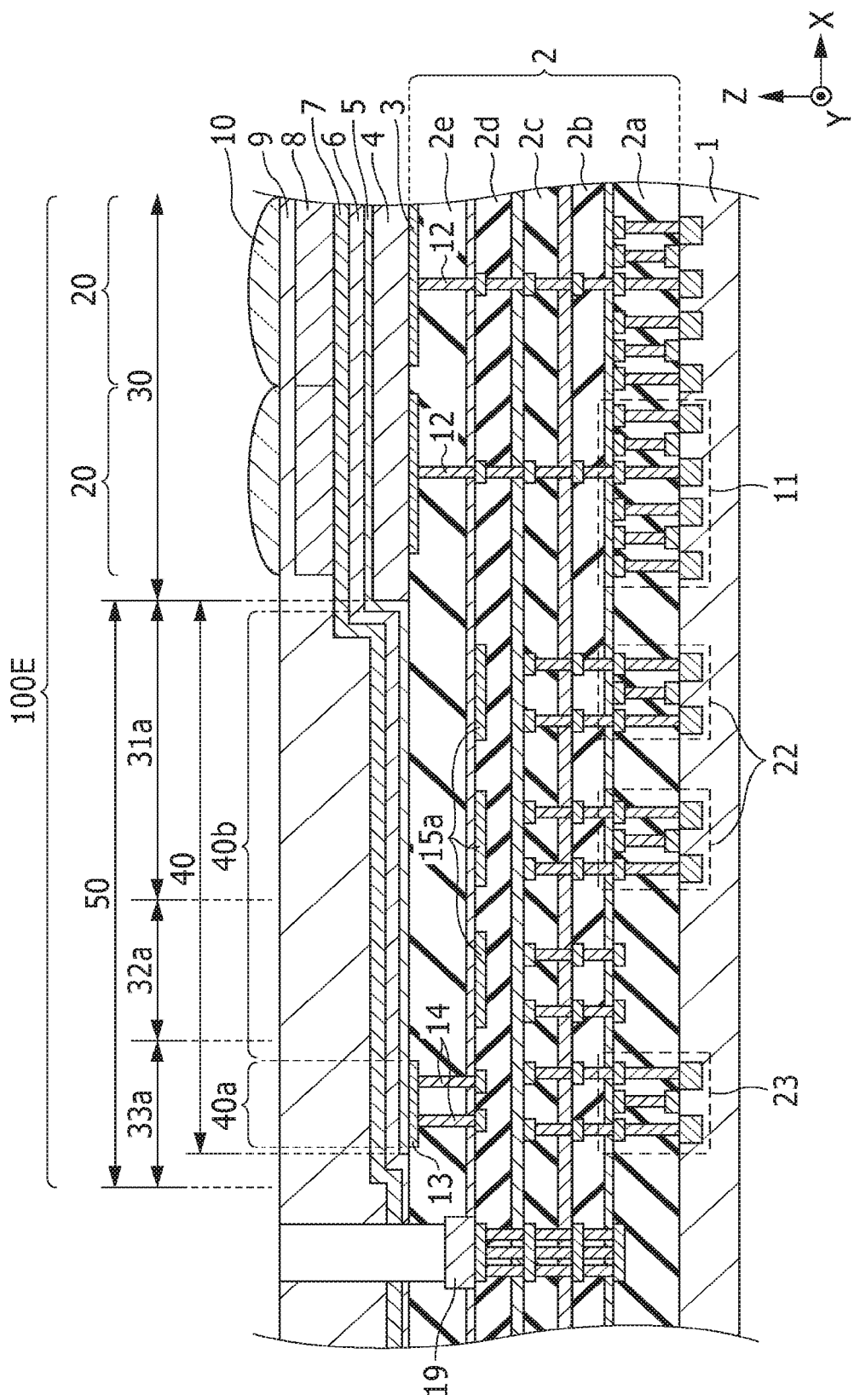
FIG. 10 is a schematic sectional view taken along line X-X in FIG. 8.

An overall configuration of an imaging device according to a third embodiment will be described with reference to FIGS. 8 to 10. FIG. 8 is a view illustrating one example of a planar structure of an imaging device 100E according to the present embodiment. FIG. 9 is a diagram illustrating an example of a planar structure of an imaging device 100F according to the present embodiment. FIG. 10 is a schematic sectional view taken along line X-X in FIG. 8.

Differences from the first and second embodiments will be described below. The present embodiment differs from the above-described embodiments in that the first region 40 is arranged so as to extend from the pixel region 30 to the digital circuitry 33a and 33b.

More specifically, in the imaging device 100E illustrated in FIG. 8, the first region 40 extends from the pixel region 30 toward the negative side in the X-axis direction and overlaps the row scanning circuitry 31a, the wire region 32a, and the digital circuitry 33a in plan view. Also, in the imaging device 100F illustrated in FIG. 9, the first region 40 extends from the pixel region 30 toward the positive side in the Y-axis direction and overlaps the column circuitry 31b, the wire region 32b, and the digital circuitry 33b in plan view.

The row scanning circuitry 31a and the column circuitry 31b are analog circuitry. The wire region 32a is a region including wires that provide connections between the row scanning circuitry 31a and the digital circuitry 33a. The wire region 32b includes wires that provide connections between the column circuitry 31b and the digital circuitry 33b.

As described above, the connection region 40a in the first region 40 may also be arranged along two or more sides of the pixel region 30. The arrangement positions of the connection region 40a and the non-connection region 40b in the first region 40 are not limited to the configurations illustrated in FIGS. 8 and 9. The connection region 40a may be arranged at a position closer to the pixel region 30 than the non-connection region 40b.

The configuration of a portion of the imaging device 100E according to the present embodiment will be described below with reference to FIG. 10. FIG. 10 is a schematic sectional view taken along line X-X in FIG. 8.

In the imaging device 100E according to the present embodiment, the peripheral circuitry has the digital circuitry 33a. The first region 40 overlaps the digital circuitry 33a in plan view. For example, the peripheral circuitry has analog circuitry (in this case, the row scanning circuitry 31a) between the pixel region 30 and the digital circuitry 33a. In plan view, the non-connection region 40b overlaps the row scanning circuitry 31a, and the connection region 40a overlaps the digital circuitry 33a.

Also, in plan view, since the first region 40 is arranged to extend to the digital circuitry 33a, the area of the first region 40 increases. This makes it possible to ensure a large area in which the upper electrode 5 covers the photoelectric conversion layer 4, the lower electrodes 3, and the peripheral portions thereof. Accordingly, it is possible to enhance the adhesion between the upper electrode 5 and the photoelectric conversion layer 4 and the adhesion between the photoelectric conversion layer 4 and the lower electrodes 3. Also, since it is not necessary to arrange the first region 40 so that it does not overlap the peripheral region 50 in plan view, unlike the known configuration, it is possible to suppress an increase in the chip area.

In addition, when the non-connection region 40b is arranged so as to overlap the row scanning circuitry 31a, which is analog circuitry, and the connection region 40a is arranged so as to overlap the digital circuitry 33a, as illustrated in FIG. 10, it is possible to reduce influences of the connection region 40a on the peripheral circuitry. For example, a pulse voltage is applied to the connection region 40a in order to adjust the light-receiving sensitivity of the photoelectric conversion layer 4. In this case, there is a possibility that circuitry arranged in layers below the connection region 40a is influenced by a voltage or electrical current in the connection region 40a. For example, there is a possibility that an output of the circuitry varies owing to coupling with a voltage applied to the connection region 40a. Alternatively, when light is incident on the upper electrode 5, electrical current flows in the upper electrode 5. When circuitry is located in layers below the upper electrode 5, there is a possibility that an output of the circuitry varies owing to coupling with an electrical current flowing in the upper electrode 5. In general, analog circuitry is susceptible to noise, compared with digital circuitry. Accordingly, when the first region 40 is arranged to extend to the digital circuitry 33a, the connection region 40a is arranged so as to overlap the digital circuitry 33a, and the non-connection region 40b is arranged so as to overlap the analog circuitry, it is possible to reduce influences that the voltage or electrical current in the upper electrode 5 has on the peripheral circuitry, particularly, the analog circuitry.

In addition, in the present embodiment, shield wires 15a are located between the pixel region 30 and the connection region 40a in plan view and are located between wires that are connected to the peripheral circuitry and the upper electrode 5 in a plane orthogonal to the semiconductor substrate 1. In FIG. 10, the shield wires 15a are arranged in a layer below the non-connection region 40b located between the pixel region 30 and the connection region 40a in plan view, that is, in a region that is included in the constituent layer 2d and that corresponds to the non-connection region 40b. This makes it possible to reduce influences of noise on the peripheral circuitry located in the layers below the non-connection region 40b and the wires that are connected to the peripheral circuitry. The shield wires 15a may be floating wires, and a predetermined voltage may be applied thereto.

In the present embodiment, the description has been given of an example in which the shield wires 15a are located between the pixel region 30 and the connection region 40a in plan view. When the connection region 40a in the first region 40 is arranged at a position closer to the pixel region 30 than the non-connection region 40b (although this case is not illustrated), the shield wires 15a may be arranged in a region that is included in a layer below the non-connection region 40b and that corresponds thereto. Also, a portion included in the peripheral region 50 and not covered by the first region 40 may also have a shield wire between the wires that are connected to the peripheral circuitry and the upper major surface of the insulating layer 2 in a plane orthogonal to the semiconductor substrate 1. This allows influences of noise on the peripheral circuitry and the wires that are connected to the peripheral circuitry to be also reduced in a portion that is included in the peripheral region 50 and that is not covered by the first region 40.

Although an example in which the connection region 40a is arranged along only one side of the pixel region 30 has been described above in the present embodiment, the connection region 40a may be arranged along two or more sides of the pixel region 30. When the connection region 40a is arranged along two or more sides of the pixel region 30, it is possible to ensure a large area in which the first region 40 and the layers therebelow overlap each other, compared with a case in which the connection region 40a is arranged along only one side. That is, when the upper electrode 5 extends beyond the four sides of the photoelectric conversion layer 4 to cover the entire photoelectric conversion layer 4 in plan view, it is possible to ensure a large area in which the first region 40 and the layers therebelow overlap each other at the four sides of the photoelectric conversion layer 4. This makes it possible to further increase the area in which the upper electrode 5 covers the photoelectric conversion layer 4 and the lower electrodes 3, thus making it possible to further enhance the adhesion between the upper electrode 5 and the photoelectric conversion layer 4 and the adhesion between the photoelectric conversion layer 4 and the lower electrodes 3.

(First Modification of Third Embodiment)

Figure 11:
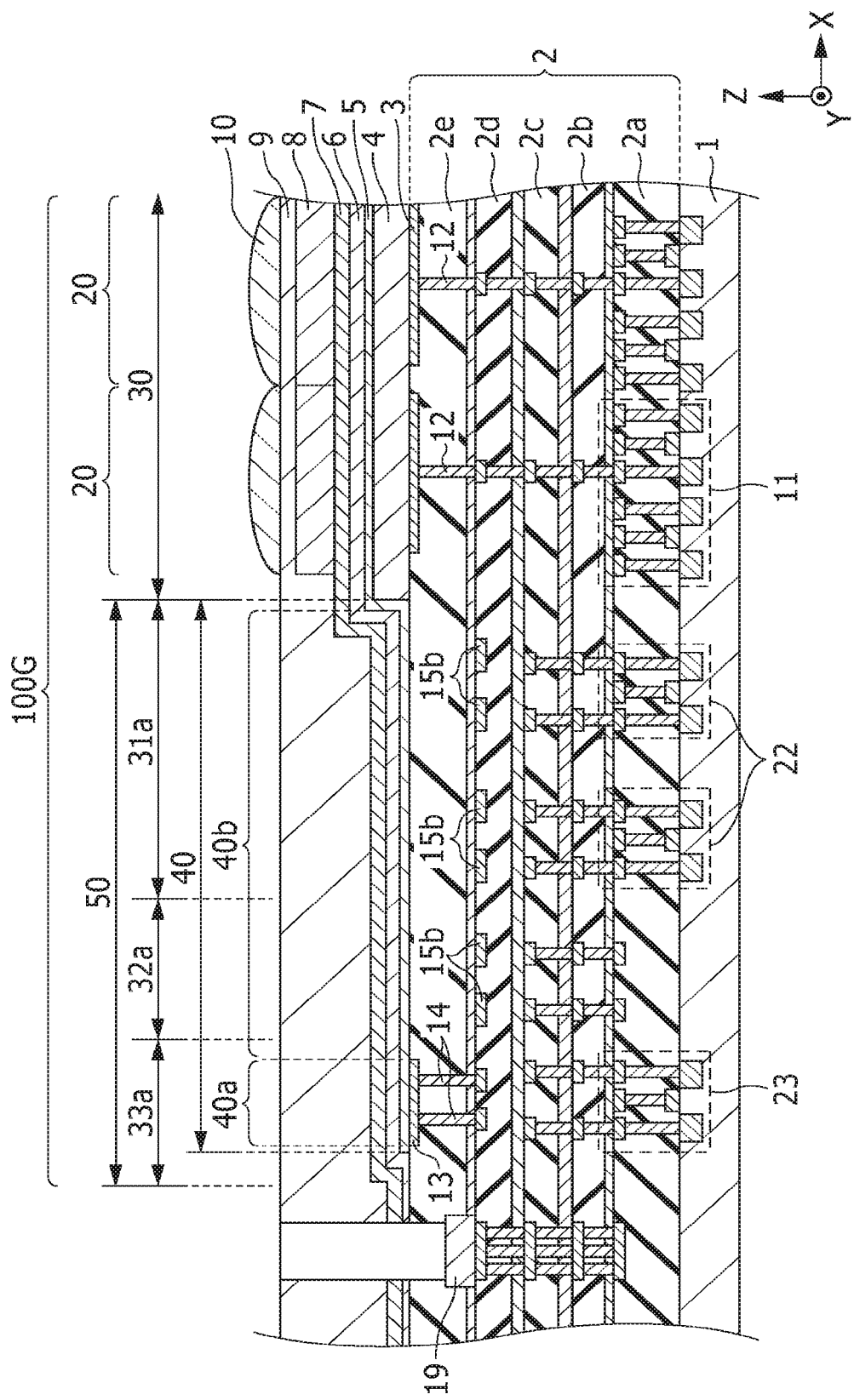
FIG. 11 is a view illustrating one example of a cross-sectional structure of an imaging device according to a first modification of the third embodiment.

Next, an imaging device according to a first modification of the third embodiment will be described with reference to FIG. 11. FIG. 11 is a view illustrating one example of a cross-sectional structure of an imaging device 100G according to this modification.

Differences from the third embodiment will be described below.

An example in which one shield wire 15a covers one transistor has been described above in the third embodiment. In this modification, one shield wire 15b is arranged so that, in plan view, it overlaps a wire that is connected to a corresponding transistor, which is a part of the peripheral circuitry. That is, each shield wire 15b has a smaller area than the area of the shield wire 15a in plan view.

For example, when the area of the peripheral region 50 is relatively large, forming the shield wires 15b so that, in plan view, they overlap the corresponding wires that are connected to the peripheral circuitry makes it possible to arrange a large number of shield wires 15b in the peripheral region 50. This makes it possible to reduce influences of noise on the peripheral circuitry and the wires that are connected to the peripheral circuitry.

(Second Modification of Third Embodiment)

Figure 12:
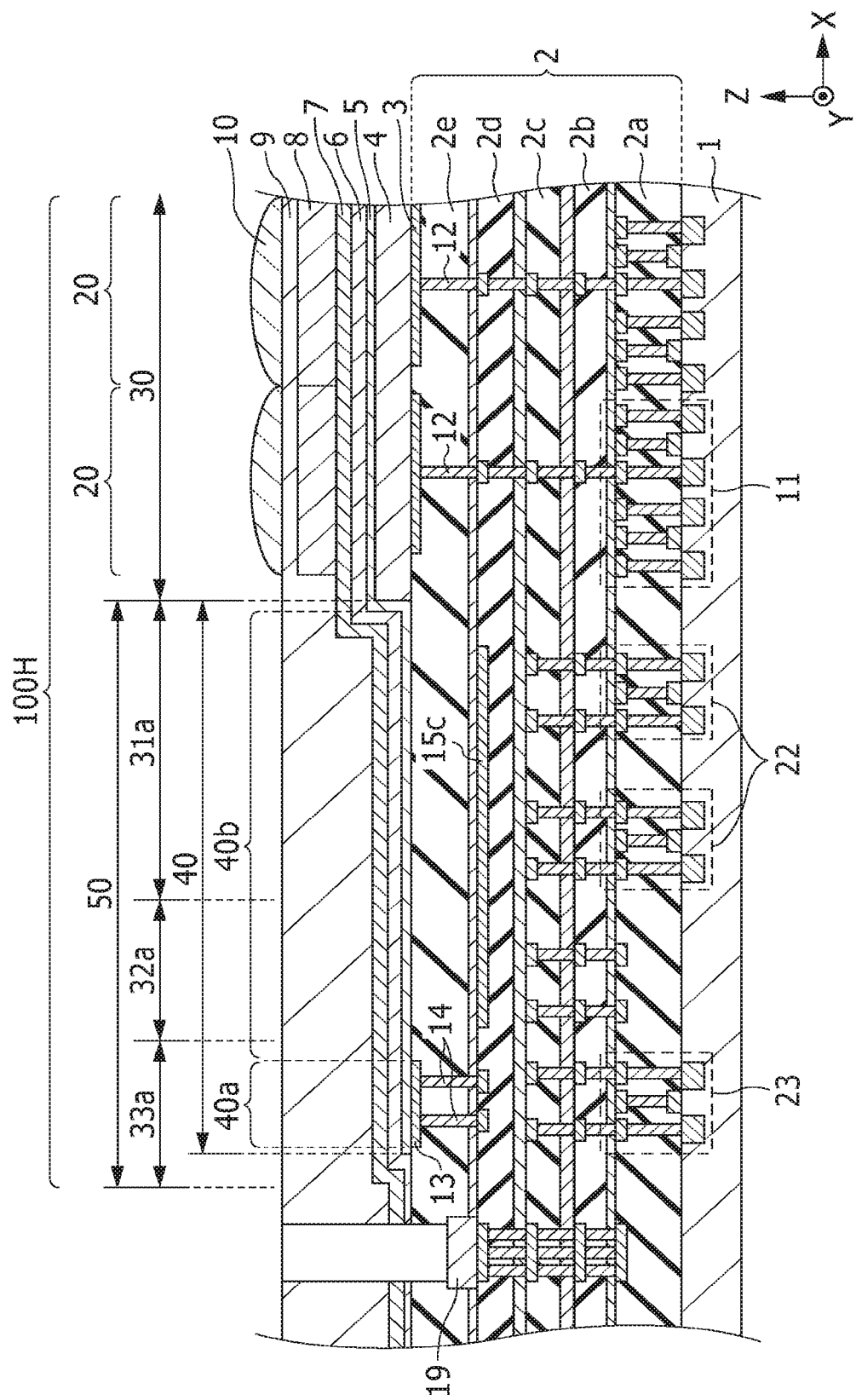
FIG. 12 is a view illustrating one example of a cross-sectional structure of an imaging device according to a second modification of the third embodiment.

Next, an imaging device according to a second modification of the third embodiment will be described with reference to FIG. 12. FIG. 12 is a view illustrating one example of the configuration of a section of an imaging device 100H according to this modification.

In this modification, a shield wire 15c is arranged in a region that is included in a layer below the non-connection region 40b and that corresponds thereto. Specifically, the shield wire 15c is arranged in the constituent layer 2d. As illustrated in FIG. 12, the shield wire 15c is arranged so as to cover, in plan view, a plurality of transistors, which are parts of the peripheral circuitry that overlaps the non-connection region 40b, and a plurality of wires that are connected to the transistors.

Since the shield wire 15c is formed with a large width so as to cover the transistors and the wires in plan view, it is possible to enhance shielding of noise in a wide range. Accordingly, it is possible to further reduce influences of noise on the peripheral circuitry and the wires that are connected to the peripheral circuitry.

Wires that are not used as the wires that are connected to the lower electrodes 3 or the peripheral circuitry may be used as the above-described shield wires 15a, 15b, and 15c.

Fourth Embodiment

Figure 13:
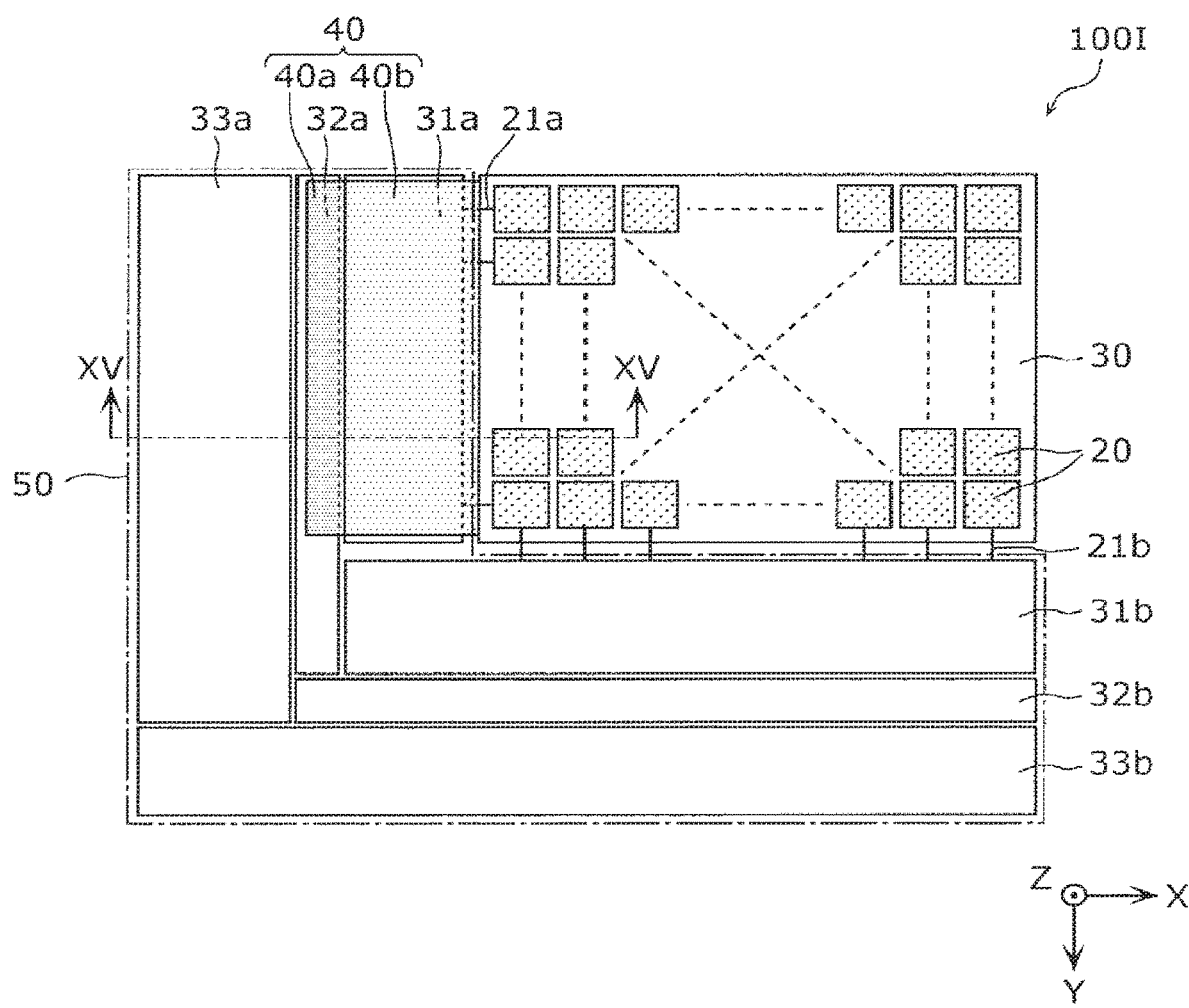
FIG. 13 is a view illustrating one example of a planar structure of an imaging device according to a fourth embodiment.
Figure 14:
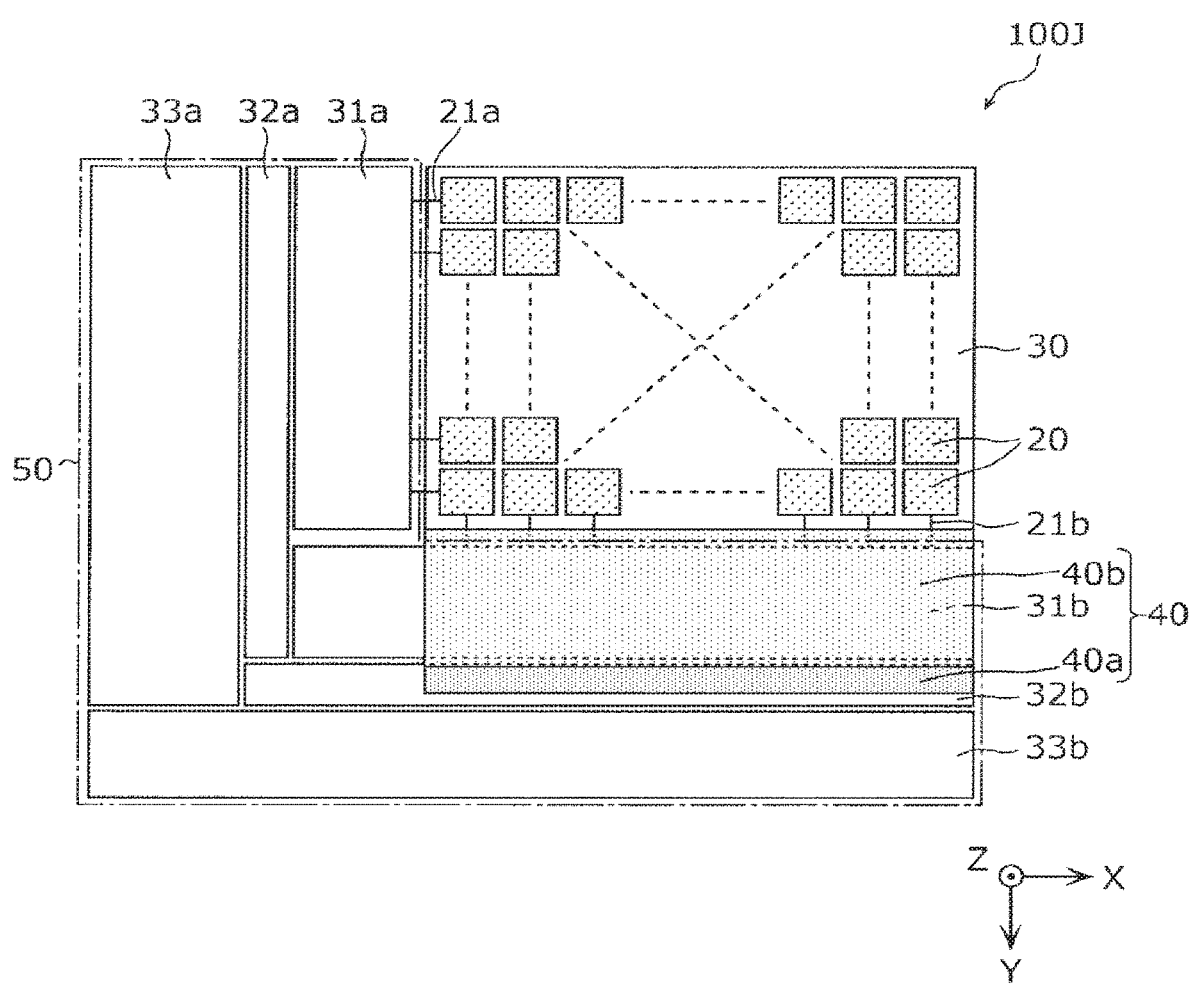
FIG. 14 is a view illustrating one example of a planar structure of an imaging device according to the fourth embodiment.
Figure 15:
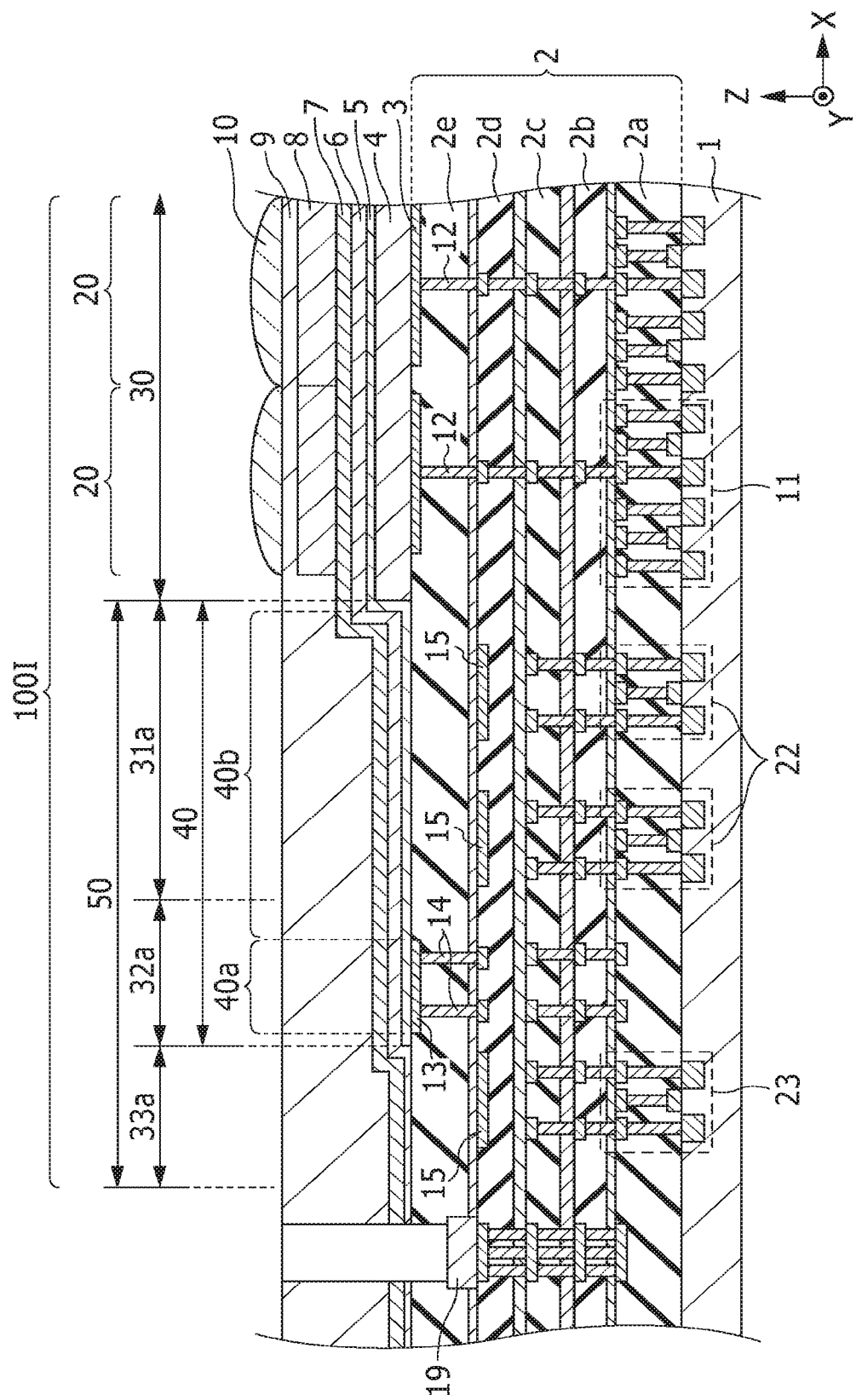
FIG. 15 is a schematic sectional view taken along line XV-XV in FIG. 13.

An overall configuration of an imaging device according to a fourth embodiment will be described with reference to FIGS. 13 to 15. FIG. 13 is a view illustrating one example of a planar structure of an imaging device 100I according to the present embodiment. FIG. 14 is a view illustrating one example of a planar structure of an imaging device 100J according to the present embodiment. FIG. 15 is a schematic sectional view taken along line XV-XV in FIG. 13.

Differences from the first to third embodiments will be described below. The present embodiment differs from the above-described embodiments in that the first region 40 is arranged so as to extend from the pixel region 30 to the wire regions 32a and 32b.

In the imaging device 100I illustrated in FIG. 13, the first region 40 extends from the pixel region 30 toward the negative side in the X-axis direction and overlaps the row scanning circuitry 31a and the wire region 32a in plan view.

Also, in the imaging device 100J illustrated in FIG. 14, the first region 40 extends from the pixel region 30 toward the positive side in the Y-axis direction and overlaps the column circuitry 31b and the wire region 32b in plan view.

The wire region 32a includes wires that provide connections between the row scanning circuitry 31a and the digital circuitry 33a. The wire region 32b includes wires that provide connections between column circuitry (not illustrated) and digital circuitry (not illustrated).

Also, as described above, the connection region 40a in the first region 40 may be arranged along two or more sides of the pixel region 30, The arrangement positions of the connection region 40a and the non-connection region 40b in the first region 40 are not limited to the configurations illustrated in FIGS. 13 and 14. The connection region 40a may also be arranged at a position closer to the pixel region 30 than the non-connection region 40b.

The configuration of a portion of the imaging device 100I according to the present embodiment will be described below with reference to FIG. 15. FIG. 15 is a schematic sectional view taken along line XV-XV in FIG. 13.

In the present embodiment, the peripheral region 50 has the digital circuitry 33a and the wire region 32a. The wire region 32a is located between the pixel region 30 and the digital circuitry 33a and includes wires connected to the digital circuitry 33a. The first region 40 overlaps the wire region 32a in plan view. For example, the peripheral region 50 has analog circuitry (in this case, the row scanning circuitry 31a) located between the pixel region 30 and the wire region 32a. Also, for example, in plan view, the non-connection region 40b overlaps the row scanning circuitry 31a, and the connection region 40a overlaps the wire region 32a.

Since the first region 40 is arranged above the wires connected to the digital circuitry 33a, as described above, it is possible to suppress an increase in the chip area without impairing characteristics of the peripheral circuitry. Now, suppose a case in which the connection region 40a is arranged so as to overlap the wire region 32a in plan view. In this case, there is a possibility that owing to coupling between a voltage applied to the connection region 40a and a voltage in wires included in the wire region 32a or coupling between electrical current flowing in the upper electrode 5 and electrical current flowing in the wires included in the wire region 32a, noise is introduced into outputs of the wires. However, the wires are connected to the digital circuitry 33a, which is relatively less susceptible to noise. Thus, even when noise is introduced into outputs of the wires, the noise is less likely to influence outputs of the digital circuitry 33a. Accordingly, since the first region 40 is arranged so as to overlap the wire region 32a in plan view, it is possible to reduce influences that the voltage or electrical current of the upper electrode 5 has on the peripheral circuitry. Also, since the first region 40 is arranged to extend to the wire region 32a in plan view, the area of the first region 40 increases. This makes it possible to ensure a large area in which the upper electrode 5 covers the photoelectric conversion layer 4 and the lower electrodes 3. Thus, it is possible to enhance the adhesion between the upper electrode 5 and the photoelectric conversion layer 4 and the adhesion between the photoelectric conversion layer 4 and the lower electrodes 3, Also, it is not necessary to arrange the first region 40 and the peripheral region 50 so that they do not overlap each other in plan view, unlike the known configuration, it is possible to increase the chip area.

Also, as illustrated in FIG. 15, the non-connection region 40b is arranged so as to overlap the row scanning circuitry 31a, which is analog circuitry, and the connection region 40a is arranged so as to overlap the wire region 32a, it is possible to reduce influences of the connection region 40a on the peripheral circuitry. For example, a pulse voltage is applied to the connection region 40a in order to adjust the light-receiving sensitivity of the photoelectric conversion layer 4. In such a case, there is a possibility that the circuitry arranged in the layers below the connection region 40a is influenced by noise. In general, analog circuitry is susceptible to noise, compared with digital circuitry. Accordingly, when the first region 40 is arranged to extend to the wire region 32a, the connection region 40a is arranged so as to overlap the wire region 32a, and the non-connection region 40b is arranged so as to overlap the analog circuitry, it is possible to reduce influences of noise on the peripheral circuitry, particularly, the analog circuitry.

Although an example in which the connection region 40a is arranged along only one side of the pixel region 30 has been described above in the present embodiment, the connection region 40a may be arranged along two or more sides of the pixel region 30. When the connection region 40a is arranged along two or more sides of the pixel region 30, it is possible to ensure a large area in which the first region 40 and the layers therebelow overlap each other, compared with a case in which the connection region 40a is arranged along one side of the pixel region 30. That is, when the upper electrode 5 extends beyond the four sides of the photoelectric conversion layer 4 to cover the entire photoelectric conversion layer 4 in plan view, it is possible to ensure a large area in which the first region 40 and the layers therebelow overlap each other at the four sides of the photoelectric conversion layer 4. This makes it possible to further increase the area in which the upper electrode 5 covers the photoelectric conversion layer 4 and the lower electrodes 3, thus making it possible to further enhance the adhesion between the upper electrode 5 and the photoelectric conversion layer 4 and the adhesion between the photoelectric conversion layer 4 and the lower electrodes 3.

OTHER EMBODIMENTS

Although an example in which the upper electrode 5 has the first region 40 that overlaps the peripheral region 50 in plan view has been described above in the first to fourth embodiments, the photoelectric conversion layer 4 may further have a region that overlaps the peripheral region 50 in plan view.

Figure 16:
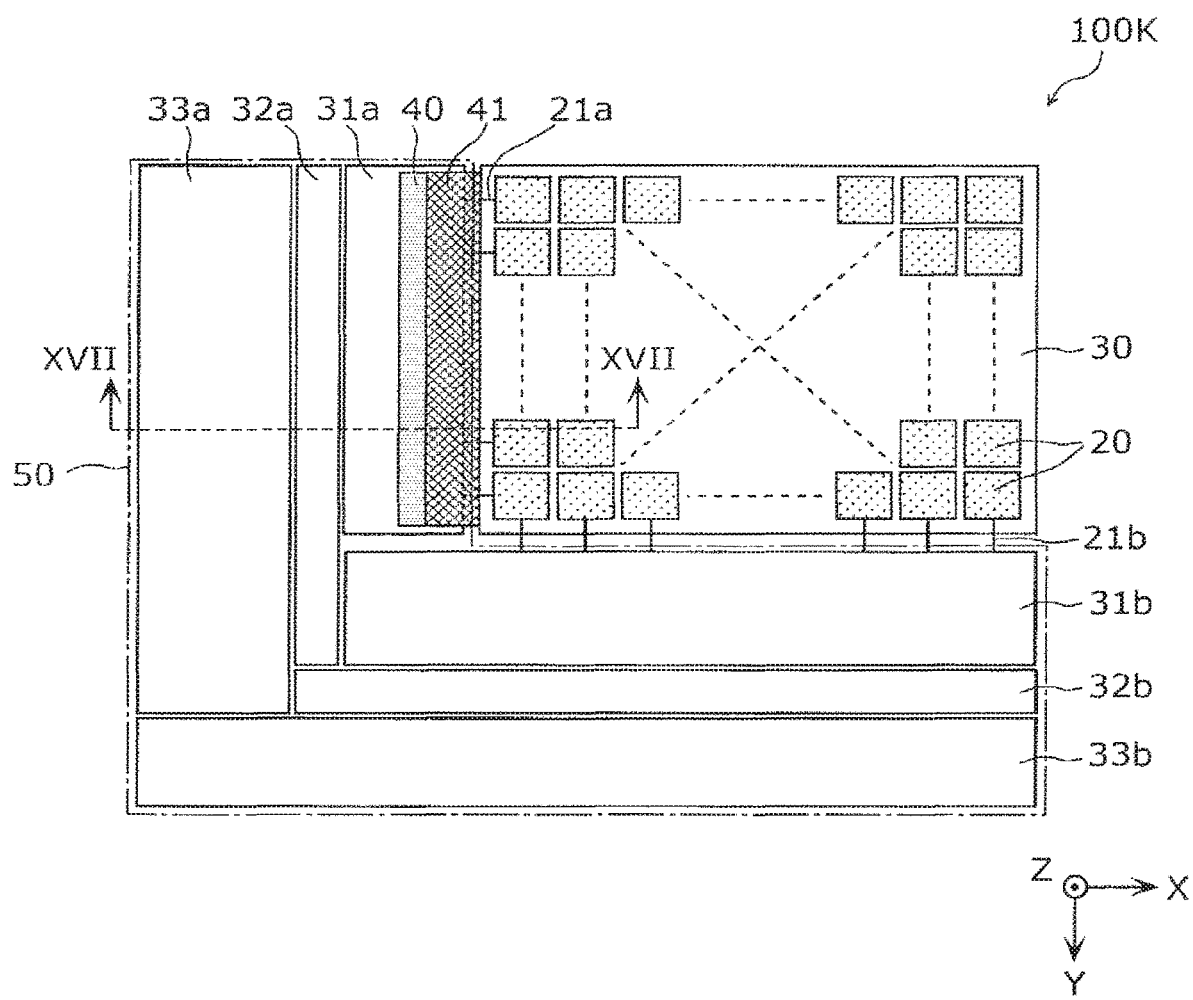
FIG. 16 is a view illustrating one example of a planar structure of an imaging device according to another embodiment.
Figure 17:
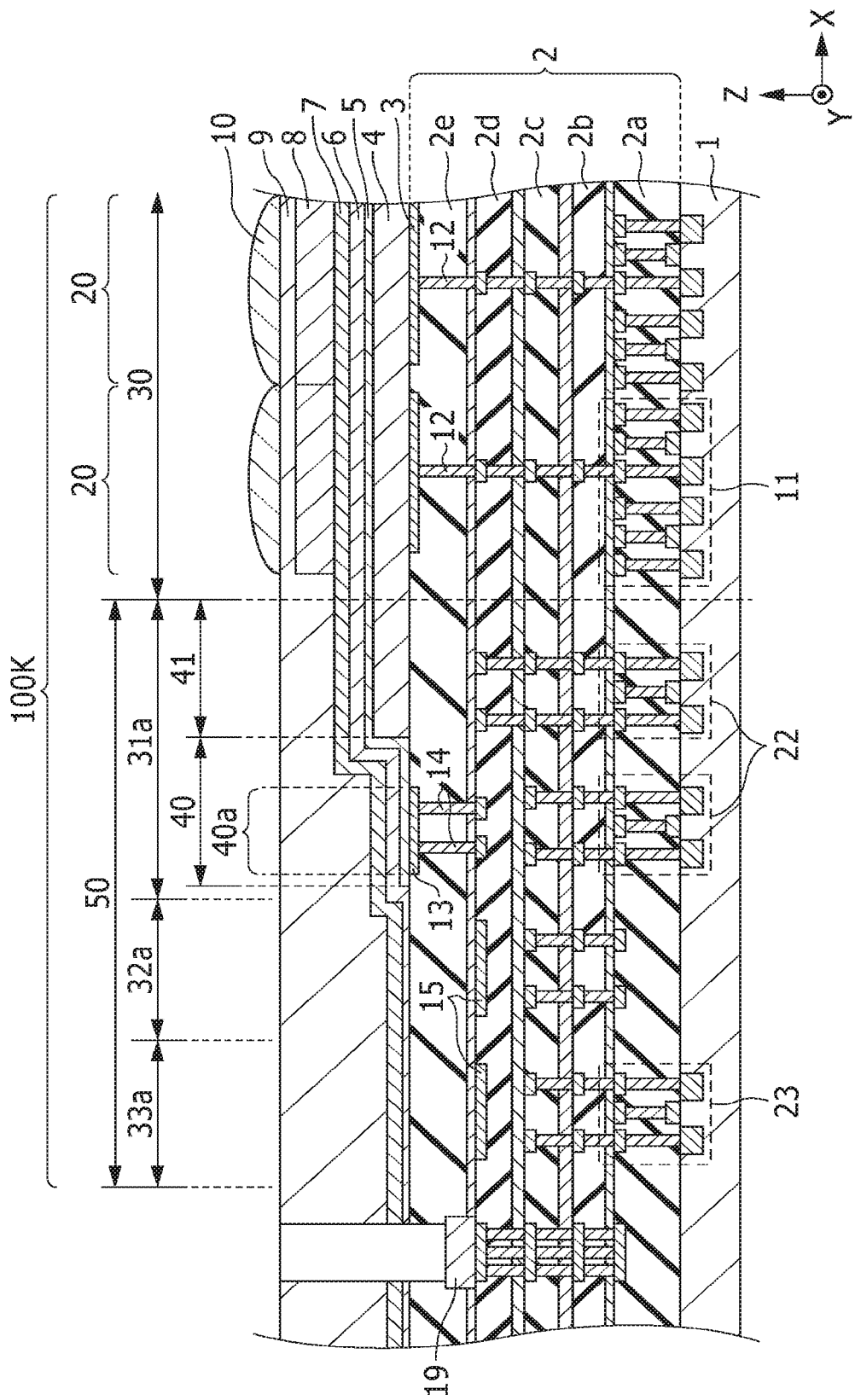
FIG. 17 is a schematic sectional view taken along line XVII-XVII in FIG. 16.

FIG. 16 is a view illustrating one example of a planar structure of an imaging device 100K according to another embodiment. FIG. 17 is a schematic sectional view taken along line XVII-XVII in FIG. 16.

In the imaging device 100K illustrated in FIG. 16, the photoelectric conversion layer 4 extends from the pixel region 30 toward the negative side in the X-axis direction and overlaps the row scanning circuitry 31a in plan view. Thus, the upper electrode 5, the buffer layer 6, and the sealing layer 7, which are stacked on the photoelectric conversion layer 4, also extend from the pixel region 30 to the negative side in the X-axis direction. A region in which the photoelectric conversion layer 4 overlaps the peripheral region 50, including the row scanning circuitry 31a and so on, in plan view is referred to as a "second region 41".

Also, in the imaging device 100K, the upper electrode 5 has a larger area than the photoelectric conversion layer 4 in plan view. The upper electrode 5 also has the first region 40 that overlaps the peripheral region 50.

As illustrated in FIG. 17, the first region 40 has the connection region 40a connected to the connection electrode 13. The connection electrode 13 contains material that differs from material of the upper electrode 5, The first region 40 may further have the non-connection region 40b (not illustrated in FIG. 17), which is not connected to the connection electrode 13.

In the present embodiment, the first region 40 and the second region 41 overlap the row scanning circuitry 31a in plan view.

Since the photoelectric conversion layer 4 is formed so that the second region 41 overlaps the row scanning circuitry 31a in plan view, as described above, the thickness of the photoelectric conversion layer 4 can be made uniform from an end portion of the pixel region 30 to a center portion thereof, that is, throughout the pixel region 30.

When the photoelectric conversion layer 4 has the second region 41, as in the present embodiment, even if the film thickness at the end portion of the photoelectric conversion layer 4 becomes small during formation of the photoelectric conversion layer 4, the end portion of the photoelectric conversion layer 4 is located outside the pixel region 30. Accordingly, the photoelectric conversion layer 4 can be formed so that, of the photoelectric conversion layer 4, only a portion having a relatively uniform film thickness is located in the pixel region 30. As a result, since the pixels 20 can be uniformly formed regardless of the arrangement position of the pixels 20, it is possible to improve the uniformity of characteristics of the pixels 20.

Also, since the first region 40 overlaps the row scanning circuitry 31a in plan view, the area in which the upper electrode 5 covers the photoelectric conversion layer 4, the lower electrodes 3, and the peripheral portions thereof increases. Accordingly, it is possible to enhance the adhesion between the upper electrode 5 and the photoelectric conversion layer 4 and the adhesion between the photoelectric conversion layer 4 and the lower electrodes 3. Since this makes it possible to enhance the uniformity of a voltage to be applied to the upper electrode 5, a voltage to be applied to the photoelectric conversion layer 4 via the connection region 40a becomes uniform in the pixel region 30.

Although the imaging device according to the present disclosure has been described above in conjunction with the embodiments and modifications, the present disclosure is not limited to the above-described embodiments and modifications. Other embodiments implemented by combining arbitrary constituent elements in the above-described embodiments and modifications, modifications obtained by making various changes conceived by those skilled in the art to the above-described embodiments and modifications within a scope not departing from the spirit of the present disclosure, and various types of equipment incorporating the imaging device according to the present disclosure are also encompassed by the scope of the present disclosure.

Although the description has been given of the imaging device in each of the above-described embodiments and modifications, the imaging device according to the present disclosure may also be applied to camera systems.

Figure 18:
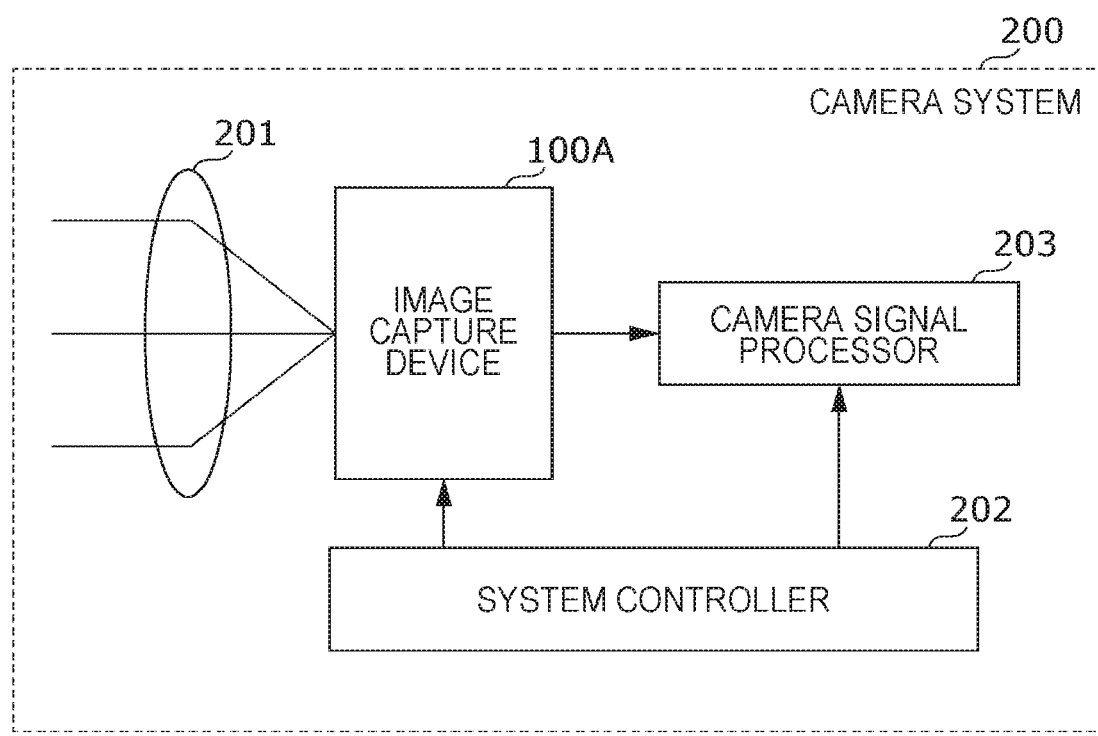
FIG. 18 is a diagram illustrating one example of a camera system including the imaging device in the present disclosure.

FIG. 18 is a diagram illustrating one example of a camera system including the imaging device in the present disclosure, Now, a description will be given of a camera system 200 including the imaging device 100A according to the first embodiment.

The camera system 200 includes a lens optical system 201, the imaging device 100A, a system controller 202, and a camera signal processor 203. The lens optical system 201 includes, for example, a lens for autofocusing, a lens for zooming, and a diaphragm. The lens optical system 201 concentrates light on an image capture plane of the imaging device 100A. The system controller 202 may be realized by, for example, a microcomputer. The camera signal processor 203 functions as signal processing circuitry that performs signal processing on data resulting from image capture performed by the imaging device 100A and outputs the resulting data as an image or data. The camera signal processor 203 performs processing, for example, gamma correction, color interpolation processing, space interpolation processing, and white balancing. The camera signal processor 203 may be realized by, for example, a digital signal processor (DSP).

The imaging device 100A according to one aspect of the present disclosure can improve uniformity of the image quality without increasing the chip area. Accordingly, use of such an imaging device 100A makes it possible to improve uniformity of the image quality, without increasing the size of the camera system 200.

The imaging device according to the present disclosure is applicable to various camera systems and sensor systems. Examples of the camera systems include a digital still camera, a medical camera, a camera for monitoring, a vehicle-mounted camera, a digital single-lens reflex camera, and a digital mirrorless interchangeable lens camera.

What is claimed is:

1. An imaging device comprising:
    a semiconductor substrate including a pixel region in which pixels are arranged and a peripheral region adjacent to the pixel region;
    an insulating layer that covers the pixel region and the peripheral region;
    first electrodes located on the insulating layer above the pixel region and arranged two-dimensionally in a column direction and a row direction;
    a photoelectric conversion layer that covers the first electrodes;
    a second electrode that covers the photoelectric conversion layer;
    detection circuitry located in the pixel region and configured to be electrically connected to the first electrodes;
    peripheral circuitry located in the peripheral region, configured to be electrically connected to the detection circuitry, and including analog circuitry and digital circuitry; and
    a third electrode located on the insulating layer above the peripheral region, wherein
    the second electrode extends above the peripheral region,
    the second electrode includes a connection region in which the second electrode is connected to third electrode,
    the connection region overlaps the analog circuitry in a plan view, and
    in all cross-sections perpendicular to a surface of the semiconductor substrate, parallel to the column direction or the row direction, intersecting at least one of the first electrodes, and intersecting the connection region, no transistor of the digital circuitry is located directly below the connection region.

2. The imaging device according to claim 1, wherein the peripheral circuitry includes a wire connected between the analog circuitry and the digital circuitry, and the connection region overlaps the wire in the plan view.

3. The imaging device according to claim 1, wherein the peripheral circuitry includes a wire for connecting the analog circuitry to external circuitry, and the connection region overlaps the wire in the plan view.

4. The imaging device according to claim 1, wherein the second electrode includes, above the peripheral region, a first region in which the photoelectric conversion layer is not present between the second electrode and the insulating layer, and the first region includes the connection region and a non-connection region other than the connection region.

5. The imaging device according to claim 4, wherein in the column direction or the row direction, the non-connection region has a length that is greater than a length of the connection region.

6. The imaging device according to claim 1, wherein in the plan view, the second electrode has an area that is larger than an area of the pixel region.

7. An imaging device comprising:
    a semiconductor substrate including a pixel region in which pixels are arranged and a peripheral region adjacent to the pixel region;
    an insulating layer that covers the pixel region and the peripheral region;
    first electrodes located on the insulating layer above the pixel region and arranged two-dimensionally in a column direction and a row direction;
    a photoelectric conversion layer that covers the first electrodes;
    a second electrode that covers the photoelectric conversion layer;
    detection circuitry located in the pixel region and configured to be electrically connected to the first electrodes;
    peripheral circuitry located in the peripheral region, configured to be electrically connected to the detection circuitry, and including analog circuitry and digital circuitry; and
    a third electrode located on the insulating layer above the peripheral region, wherein
    the second electrode extends above the peripheral region,
    the second electrode includes a connection region in which the second electrode is connected to third electrode,
    the connection region overlaps the digital circuitry in a plan view, and
    in all cross-sections perpendicular to a surface of the semiconductor substrate, parallel to the column direction or the row direction, intersecting at least one of the first electrodes, and intersecting the connection region, no transistor of the analog circuitry is located directly below the connection region.

8. The imaging device according to claim 7, wherein the peripheral circuitry includes a wire connected between the analog circuitry and the digital circuitry, and the connection region overlaps the wire in the plan view.

9. The imaging device according to claim 7, wherein the peripheral circuitry includes a wire for connecting the analog circuitry to external circuitry, and the connection region overlaps the wire in the plan view.

10. The imaging device according to claim 7, wherein the second electrode includes, above the peripheral region, a first region in which the photoelectric conversion layer is not present between the second electrode and the insulating layer, and the first region includes the connection region and a non-connection region other than the connection region.

11. The imaging device according to claim 10, wherein in the column direction or the row direction, the non-connection region has a length that is greater than a length of the connection region.

12. The imaging device according to claim 7, wherein in the plan view, the second electrode has an area that is larger than an area of the pixel region.

13. The imaging device according to claim 1, wherein in a cross-section perpendicular to the surface of the semiconductor substrate, parallel to the column direction or the row direction, intersecting at least one of the first electrodes, the analog circuitry includes a transistor that is located directly below the connection region.

14. The imaging device according to claim 7, wherein in a cross-section perpendicular to the surface of the semiconductor substrate, parallel to the column direction or the row direction, intersecting at least one of the first electrodes, the digital circuitry includes a transistor that is located directly below the connection region.

* * * * *